United States Patent [19]
Lee et al.

[11] Patent Number: 5,586,100
[45] Date of Patent: Dec. 17, 1996

[54] TRANSVERSAL FILTER AND METHOD FOR CANCELLING INTERSYMBOL INTERFERENCE

[75] Inventors: Tzuo-Chang Lee; James H. Lauffenburger; Steve S. Popovich, all of Colorado Springs, Colo.

[73] Assignee: Literal Corporation, Bethel Park, Pa.

[21] Appl. No.: 955,618

[22] Filed: Oct. 13, 1992

[51] Int. Cl.$^6$ .............................. G11B 7/00; G06F 17/10
[52] U.S. Cl. ..................... 369/124; 369/59; 369/32; 364/724.16; 375/232
[58] Field of Search ................... 369/124, 59, 32, 369/44.34, 44.37; 375/232, 37; 364/724.2, 724.16, 825

[56] References Cited

U.S. PATENT DOCUMENTS

| | | | |
|---|---|---|---|
| 3,764,914 | 10/1973 | Karnaugh | 375/232 |
| 4,286,318 | 8/1981 | Immink et al. | 369/44 |
| 4,539,691 | 9/1985 | Ogawa et al. | 375/37 |
| 5,012,460 | 4/1991 | Popovich et al. | 369/32 |
| 5,031,168 | 7/1991 | Moore | 369/59 |
| 5,166,914 | 11/1992 | Shimada et al. | 369/32 |

FOREIGN PATENT DOCUMENTS 0150114  7/1985  European Pat. Off. .

OTHER PUBLICATIONS

Patent Abstracts of Japan, vol. 012, No. 497 (P–806), 26 Dec. 1988 & JP,A,63 206 907 (NEC) 26 Aug. 1988.

T. Kameyama et al., "Improvement of Recording Density by Means of Cosine Equalizer," IEEE Transaction on Magnetics, vol. MAG–12, No. 6, Nov., 1976.

Roger E. Ziemer et al., "Introduction to Digital Communication," 1992, pp. 216–225.

Shahid Qureshi, "Adaptive Equalization," IEEE Communications Magazine, Mar. 1982, pp. 9–16.

John G. Proakis, "Advances in Equalization for Intersymbol Interference", Advances in Communication Systems, vol. 4, NY, Academic Press, 1975.

Primary Examiner—Georgia Y. Epps
Assistant Examiner—Kim-Kwok Chu
Attorney, Agent, or Firm—Merchant, Gould, Smith, Edell, Welter & Schmidt

[57] ABSTRACT

An apparatus and method for filtering intersymbol interference from an information signal generated from a storage medium. This apparatus utilizes a delay line, gain devices, summing devices, and has specified transfer functions. Furthermore, this apparatus and method can make real time adjustments in order to maintain an optimal level of filtering.

42 Claims, 16 Drawing Sheets

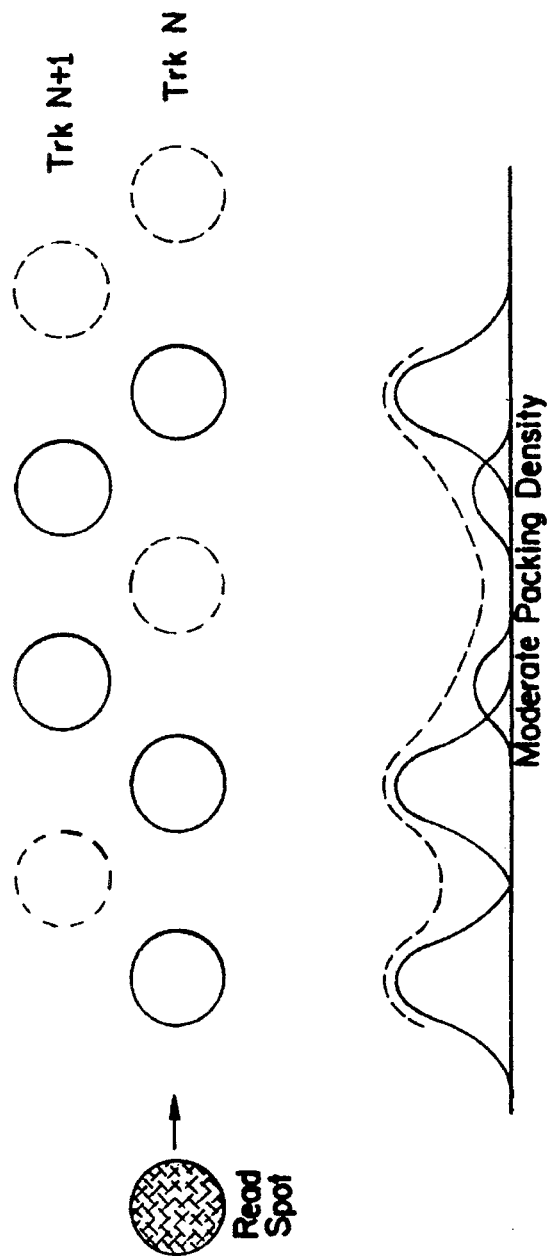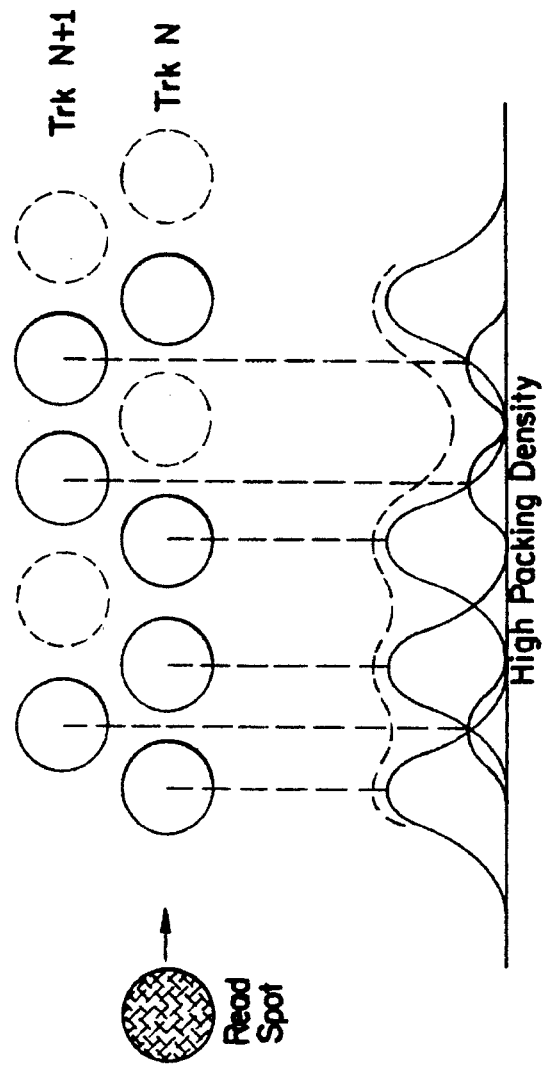
FIG. 18
FIG. 19

Moderate Density

High Density

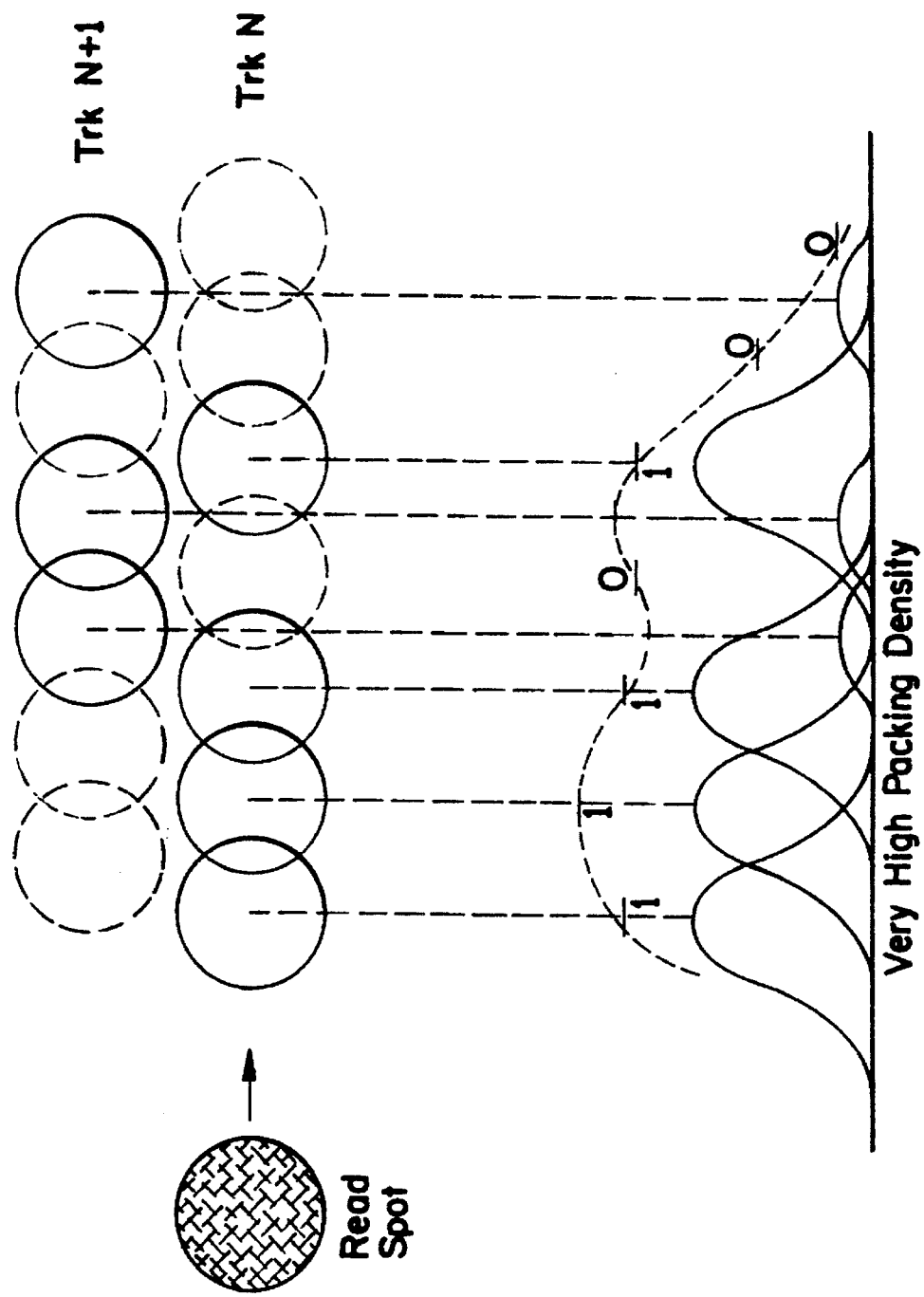

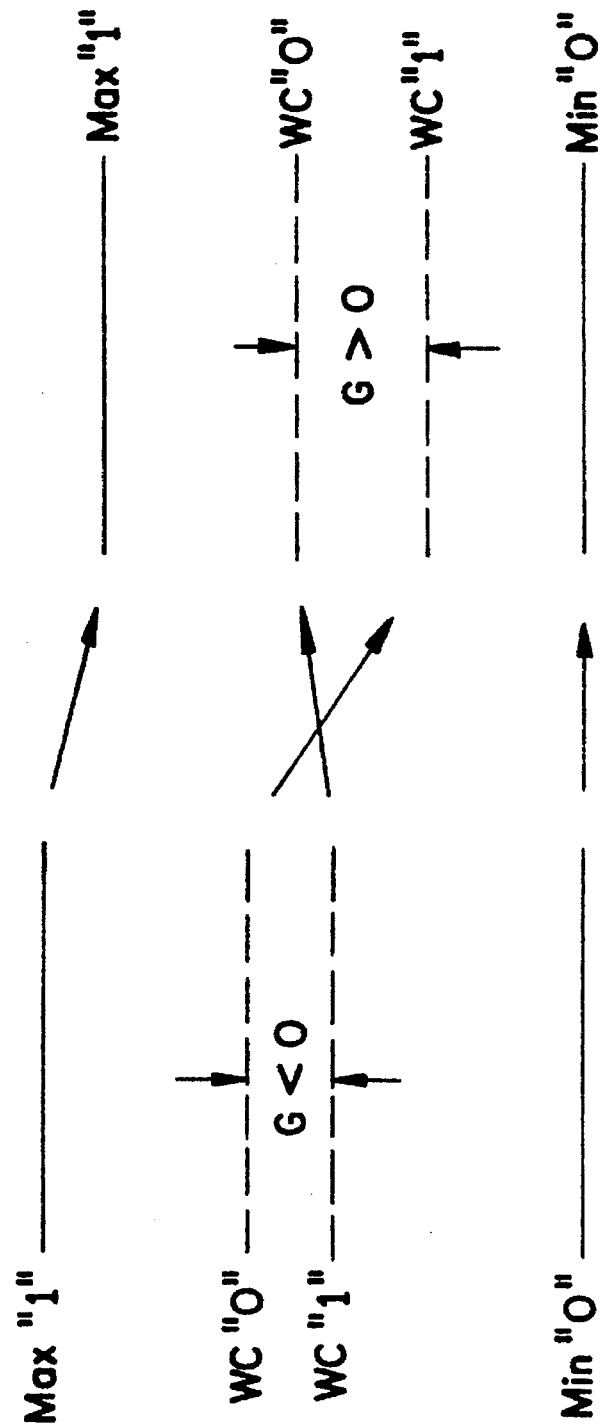

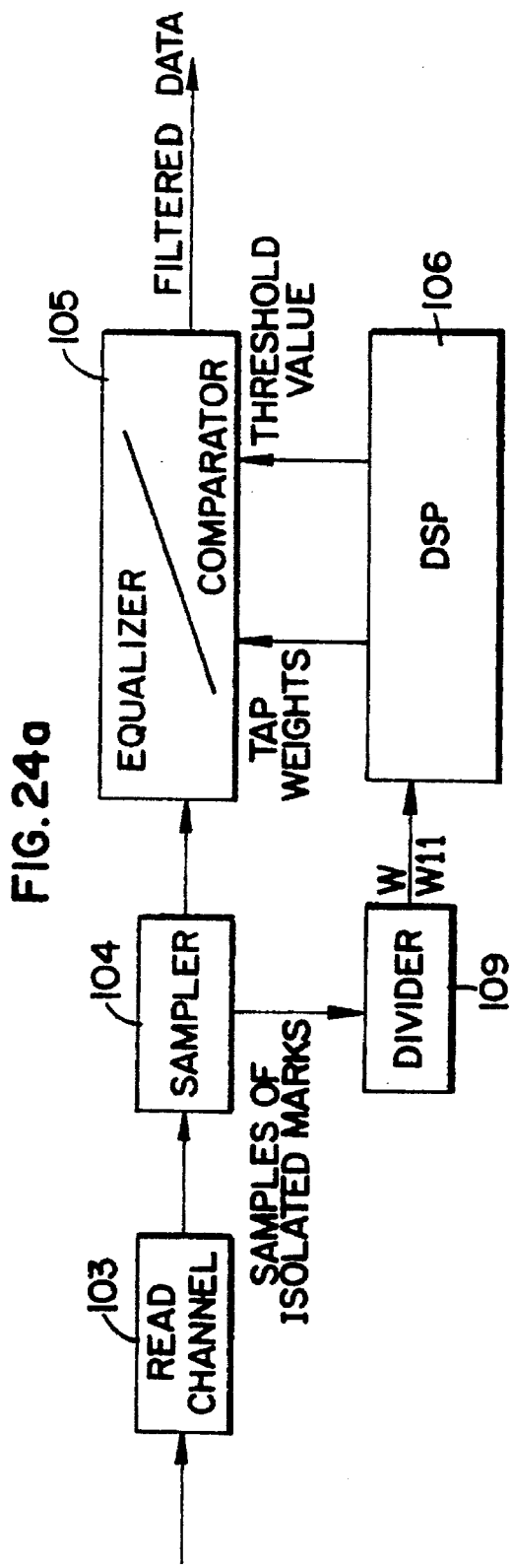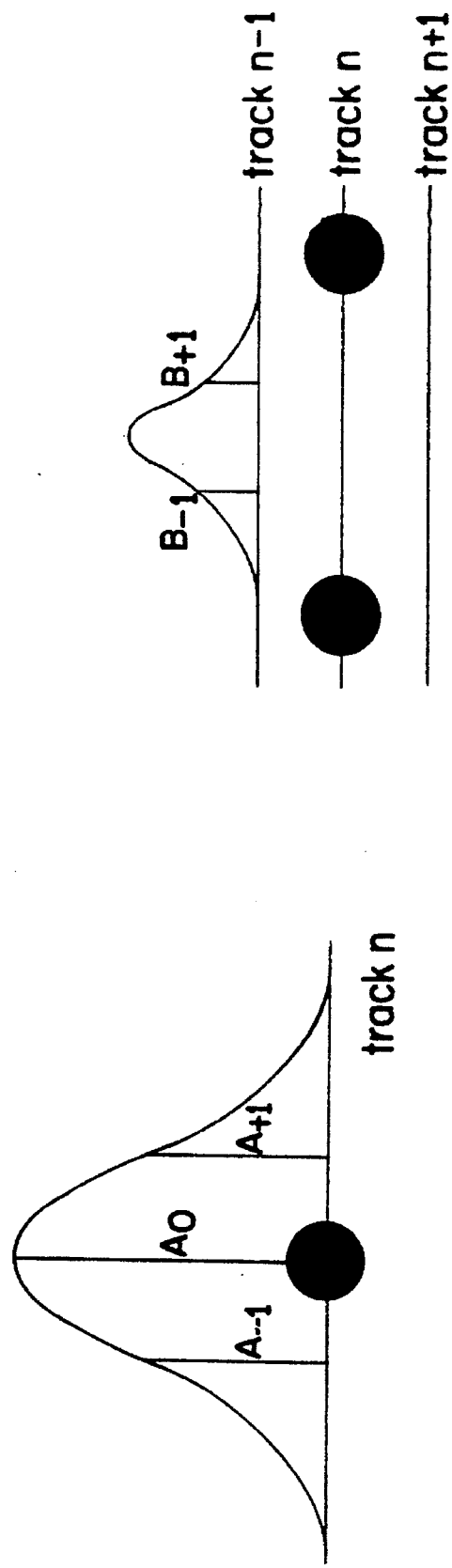
FIG. 24a
FIG. 24b
FIG. 24c

Signal flow for Data Read

TRANSVERSAL FILTER AND METHOD FOR CANCELLING INTERSYMBOL INTERFERENCE

FIELD OF THE INVENTION

This invention generally relates to information storage systems and more particularly to an apparatus and method for filtering signals corresponding to digital information retrieved from a storage media.

DESCRIPTION OF THE ART

One aspect of developing computer technology is the miniaturization of computer hardware and peripherals. Original computers had limited capabilities and required a great deal of space. However, as technology progressed, computers have become more powerful. This trend enables engineers to design products and software that are capable of processing a great deal of information. In order to handle this information, storage media that has a large capacity is required.

Many forms of information storage media currently exist, including magnetic tapes, magnetic disks, and optical disks. With magnetic or optical disks, the information is stored generally in a series of concentric circles or "tracks" oriented around the disk's hub. This stored information is in the form of digital bits called "pits" or "symbols" or "marks" that are "marked" or "written" on or into the storage media. The digital information is generally written and retrieved along these tracks through the use of a Random Access Memory (RAM) head that is capable of either marking the media along the track or sensing the existing marks. For magnetic disks, this device is in the form of a magnetic head. For optical disks, this device is in the form of an optical head in which a laser (together with beam forming and beam directing optics) and light sensitive devices are used.

Each type of storage media has finite space or surface area on which to store information. It is desireable to store as many bits of information as possible on the finite media space. One technique of increasing the amount of information on the disk is to move the marks closer to one another. Reducing the distance between adjacent tracks and/or marks along the same track increases the density and accomplishes this compression (i.e., the amount of space around each mark is decreased). An example of a technique for increasing the density of information stored on an optical disk is disclosed in U.S. Pat. No. 5,031,168, the disclosures and teaching of which are hereby incorporated by reference. This patent describes a formatting technique whereby the marks on adjacent tracks are offset in such a manner that there is track coherency between the tracks. How close adjacent tracks can be spaced from one another is limited by the interference that exists between adjacent marks from different tracks during a reading operation. The purpose of mark offset on the adjacent track is to reduce crosstalk between adjacent tracks. Such interference, generally referred to as "intersymbol interference" (ISI) occurs when the RAM head picks up signals or interference from the marks that are adjacent to the mark it is attempting to read.

One known technique to reduce ISI is accomplished through the use of a three-tap transversal filter. See, for example, T. Yameyama et al., "Improvement of Recording Density by Means of Cosine Equalizer," IEEE Transaction on Magnetics, Vol. MAG-12, No. 6, Nov., 1976. Such a filter consists of a delay line which is tapped at three different intervals. Signals from each tap pass through a variable gain device and into a common summing device. When the tap weight and the delay time are properly set, the effect of the summing device is to reduce the interference caused by adjacent marks. In effect, the desired signal is slimmed in the time domain, thereby resulting in less ISI.

Under ideal operating conditions, the marks have a certain size and shape so that the amplitude and interference characteristics of the retrieved information signal is predictable. However, there are several parameters that affect actual mark size in an operating environment. The factors include temperature changes, storage medium sensitivities, and write power inaccuracies. Changes in the mark size and shape effect the amplitude, symmetry, and interference characteristics of the retrieved signal thereby reducing the effectiveness of the equalization filter. That is, since the parameters of the retrieved signal change, the ISI reducing filter must recalculate and reset the tap weights in accordance with these changes to minimize ISI. However, in the past although this has been desired, it has not been implemented due to costs and complexities of the calculation, as discussed in more detail below.

A transversal filter may have more than three taps, which eliminates a greater amount of intersymbol interference. The trade-off is that noise generally also increases with the number of taps. In the prior art, see for example Roger E. Ziemer et al., "Introduction to Digital Communication," 1992, pp. 216–225, one type of transversal filter utilized a zero-forcing function to eliminate intersymbol interference. This type of transversal filter virtually eliminates all ISI as the number of taps is increased. The problem with this filtering technique is that the zero-forcing function also amplifies noise. Furthermore, calculating the tap weights for a zero forcing function requires solving a set of simultaneous equations. In a digital signal processor ("DSP") such calculations require a large volume of code space and are time consuming. As a result, real-time error correction is very difficult to implement. These shortcomings limit the applicability of zero forcing functions to optical storage devices because these devices (1) have a significant amount of noise at low frequencies and (2) require real time error correction in order to maximize the rate of information retrieval.

Although other types of transversal filters are more effective at limiting noise, they have other shortcomings that limit their applicability to optical storage devices. For example, a least mean square error equalizer utilizes an iterative process in which the tap weights are continuously adjusted until the mean square error of a known data stream is minimized. Thus, it is relatively time consuming to adjust the tap weights if the conditions of the storage medium change. For example, if adjusting the tap weight requires ten iterations, the optical disk must revolve ten times. Such delay is very inefficient and renders the filter impractical to implement.

Furthermore, all existing types of transversal filters treat intersymbol interference from adjacent tracks as random noise. Hence, a zero-forcing filter amplifies the adjacent track intersymbol interference and distorts the information signal.

Consequently, there is a need in high density storage for an information retrieval filter and device in which: (1) the tap weights of the equalization filter can be optimized so that the intersymbol interference is minimized to an acceptable level, and the noise is attenuated rather than amplified; (2) the tap weights can be adjusted in an efficient manner if the mark size on the storage medium has changed; and (3) the intersymbol interference from adjacent tracks is more effectively filtered.

SUMMARY OF THE INVENTION

The present invention provides a simple and efficient apparatus and method for filtering ISI from information signals. When information is retrieved from a storage media, it passes through a transversal filter with a special transfer characteristic to reduce ISI. This invention also provides means and formulae for calculating and setting the operating parameters of the filter, and for calculating and setting the detection threshold of the binary ones versus the binary zeros. Another important aspect of this filter is that it attenuates, rather than amplifies noise that has a noise spectra with large noise energy content at low frequencies, such as is found in optical, recording media. A further aspect of this invention is its ability to make real-time adjustments of the tap weights and the decision threshold when the mark size has varied for a variety of reasons in the operating environment; thereby a maximum rate of data retrieval is maintained.

In a first preferred embodiment constructed according to the principles of the present invention, it is assumed that the marks on the information storage medium have a uniform size and symmetrical shape. These conditions may commonly be found in environments where read only media is utilized since such media is typically manufactured using special quality control tools. However, such conditions may be found in other media, as those skilled in the art will appreciate. Under these conditions, the algorithm used to determine and set the tap weights for the filter is easily implemented. Given the frequency of sampling and the amplitude profile of an isolated mark retrieved from the storage medium, the invention comprises a filter for filtering the signal whereby the filter has a plurality of taps and the filter is defined by a transfer function having the following form:

$$D^{-2n}F(s)=1-W.(D+D^{-1})+W^2.(D+D^{-1})^2+ \ldots +(-1)^n.W^n.(D+D^{-1})^n$$

wherein W is derived from the readout pulse profile of a substantially isolated written mark; W equals the ratio of the sampled amplitude at a time instant T earlier or T later than the instant when the mark center occurs divided by the sample amplitude at the instant when the mark center occurs (the latter sample amplitude is substantially the peak of the readout pulse profile); D is the delay operator and equals $e^{sT}$, where s is the Laplace operator; and T is the data clock period. Wherein the tap weights are determined by collecting terms of the same order in D from the above transfer function and there are a total of 2n+1 taps.

The fact that the present invention equalization filter attenuates, rather than amplifies noise is due to the highly attenuating characteristics of the filter at low frequencies even though the filter amplifies noise near half the data sampling frequency, as discussed further below. For a recording media exhibiting a large noise content at low frequencies, such as is found in the optical recording media, the present invention filter is particularly advantageous since it attenuates where most noise occurs, but amplifies in those regions where the noise content is much lower. Therefore, the net overall result based on analysis is that noise can be attenuated rather than be amplified. Almost all known transversal filters amplify noise.

Furthermore, the threshold value (DL) for determining whether the resultant output from the filter is a binary one or a binary zero can be computed from the value W and W11 as follows:

$$DL=0.5 \cdot (1-2W)(1+4W^2)(1+2W+4W11)$$

wherein W11 is derived from a second pulse profile on an adjacent track from the track where the isolated mark is located; it is the ratio of the sampled amplitude on an adjacent track to the track where the isolated mark is located and at a time instant T/2 earlier or T/2 later than the instant when the mark center occurs to the sample amplitude at the instant when the mark center occurs and on the track where the isolated mark is located. The above formula of DL is strictly true only if the mark offset in the adjacent track is one half bit spacing; otherwise the formula has to be properly adjusted.

However, for WORM and/or erasable disks the size of the mark may vary under field operating conditions. One effect of this change is a change on the amplitude profile of the read out pulses and thereby the values of W and W11 are changed. A feature of the present invention, however, is that the tap weights may be recalculated in real-time by remeasuring the sample amplitudes of the readout pulses. A divider can then recalculate both the value of W and W11 while a digital signal processor ("DSP") recalculates the new tap weights and the new detection threshold.

Therefore, according to another aspect of the present invention, remeasurement of the readout pulses is accomplished by an apparatus for retrieving information from an information storage medium wherein the retrieved information signal has at least some amount of ISI, the apparatus comprising: a storage medium; means for retrieving information from isolated marks on the storage medium in the form of a pulse; means for measuring W and W11 from retrieved pulses; means for filtering the signal wherein the amount of intersymbol interference is reduced; and means for establishing the detection threshold.

The advantage of the invention is that it, in combination with the new transfer function, allows an information storage apparatus to make real-time error corrections in order to maintain an optimal level of intersymbol interference filtering.

In field operating conditions, the contour of the mark may also vary resulting in an asymmetrical shape. In this situation the original setting of the tap weights do not filter an optimal level of intersymbol interference. Thus, the present invention recalculates and resets the tap weights under this condition. Then the interference ratios will have different values, $W^-$ and $W^+$, respectively. In this situation, the present invention comprises a filter for filtering the signal similar to the earlier one and the filter is defined by a transfer function having the following form:

$$F(s)=1-(W^+.D+W^-.D^{-1})+(W^+.D+W^-.D^{-1})^2+ \ldots +(-1)^n.(W^+.D+W^-.D^{-1})^n$$

The advantage of this transfer function is that it allows the DSP to calculate tap weights that provide an optimal level of filtering regardless of the shape of the marks.

Another feature of the present invention produces optimal filtering of intersymbol interference when the marks are organized in a certain configuration. In this configuration the marks on a first track are spaced in equal distant intervals. On the adjacent tracks, the marks are shifted so that they are located at points juxtaposed to the midpoint between the marks on the first track. This configuration provides even sampling points that coincide with the location of the marks on the target track and odd sampling points that coincide with the location of the midpoint between the marks on the target track. The target track is that track from which the RAM head is attempting to retrieve information. See for example U.S. Pat. No. 5,031,168.

This configuration allows the development of a filter and a transfer function which produces optimal filtering of intersymbol interference that is generated from marks on tracks adjacent to the target track. This technique of sampling allows for the development on an apparatus for filtering a signal in order to minimize intersymbol interference from marks on both the same track and an adjacent track, the apparatus comprising: a first means for filtering an information signal that is sampled at even intervals; a second means for filtering an information signal that is sampled at odd intervals; and means for adding the information signal filtered by the first filtering means to the information signal filtered by the second means for filtering. The transfer function for the first sampling means is defined as $F(s)=1+W_{20}(d^2+D^{-2})$, and the transfer function for the second sampling function is defined as $F(s)=1+W_{10}(D+D^{-1})$. $W_{20}$ is defined as the same interference ratio as W discussed previously; the samples are taken at, say, the even points of sampling. $W_{10}$ is defined as the interference ratio of the sample amplitude taken at the nearest odd point of sampling to the sample amplitude at the mark center.

These and various other advantages and features which characterize the present invention are pointed with particularity in the claims annexed hereto and forming a part hereof. However, for a better understanding of the invention, its advantages and objectives obtained by its use, reference should be made to the drawings which form a further part hereof and the accompanying descriptive matter, in which there is illustrated and described a preferred embodiment to the present invention.

BRIEF DESCRIPTION OF THE DRAWINGS

In the drawings wherein like reference numerals and letters indicate corresponding elements throughout the several views:

FIG. 18 is a graphical illustration of moderate packing density and the resulting wave form;

FIG. 19 is a graphical illustration of a high packing density of marks on a storage media and the resulting waveform;

FIG. 22 is a graphical illustration of a very high packing density of marks on a storage media and the resulting wave form;

FIG. 23 is a graphical illustration of gap differential through the utilization of digital filters;

FIG. 24a is a functional block diagram of various components utilized to implement the present invention;

FIG. 24b is a diagram of an isolated mark and unscaled sampling points;

FIG. 24c is a diagram of an isolated mark with adjacent tracks, and unscaled sampling points.

DETAILED DESCRIPTION OF THE INVENTION

The principles of this invention apply to the filtering of signals generated by a RAM head reading a storage media for the purpose of reducing the ISI. The result of such ISI reduction is the increase of the band gap between the worst case high and low signals. By increasing the band gap the accuracy is improved and the bit error rate is minimized. In essence, a filter is utilized to minimize the sample amplitudes at time instants other than when the mark center occurs on the storage media; thereby effectively reducing ISI and thus increasing the band gap. A preferred application for this invention is in the filtering of signals in an optical disk environment. Such application is typical, however, of only one of the innumerable types of applications in which the principles of the present invention can be employed.

In order to facilitate an understanding of the present invention, a discussion of the components which comprise the preferred embodiment filter and attendant devices will be deferred pending a discussion of the derivation of the mathematical algorithms and theory used to implement this invention.

Algorithms and Theory

Figure 1A:
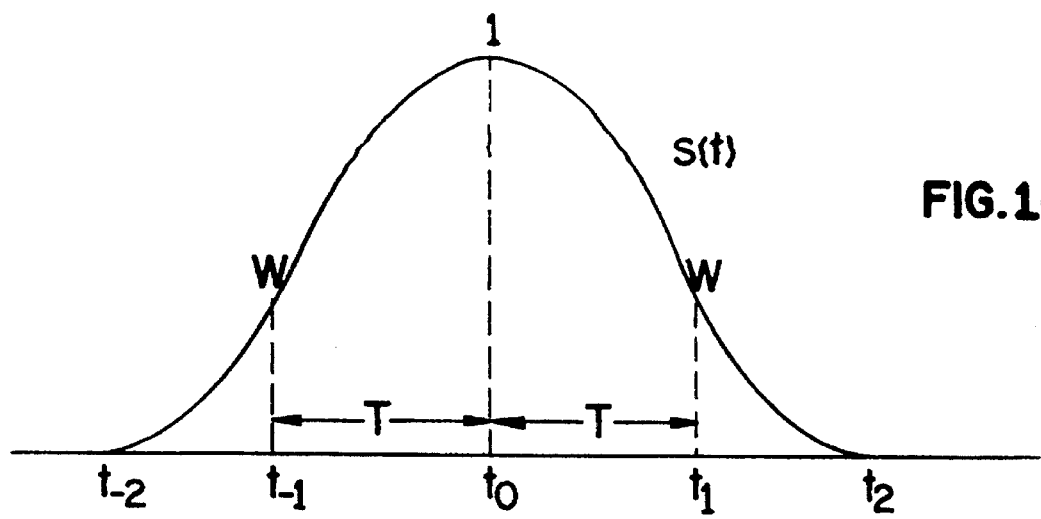
FIG. 1(a) is a schematic diagram of a read out pulse profile, in the time domain, from an isolated mark on the storage media.
Figure 1B:
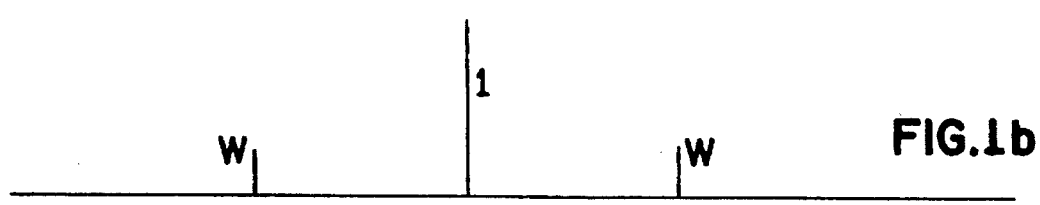
FIG. 1(b) is a schematic diagram of a read out pulse profile, in the frequency domain, from an isolated mark on the storage media.

This invention may be considered a general method of pulse reshaping for the purpose of minimizing ISI at the data sampling points. It can be carried out either as an analog filter, in which case the filter will be placed near the front end of the read channel, or as a digital filter, in which case it will be placed in the back end of the read channel (see FIG. 25). The present invention can be carried out effectively and flexibly if implemented with a digital equalizer (as used herein, the term equalizer may be considered as a transversal filter which implements the principles of this invention). Turning first to FIGS. 1a and 1b, the amplitudes of a pulse at the read channel sampling instants are given by:

$$S(t)=\delta(t)+W\cdot\delta(t-t_2)+W\cdot\delta(t+t_{-2}) \quad (1)$$

In the frequency domain, the pulse amplitudes are given by $$S(s)=1+W\cdot(D+D^{-1}) \quad (2A)$$

Figure 2:
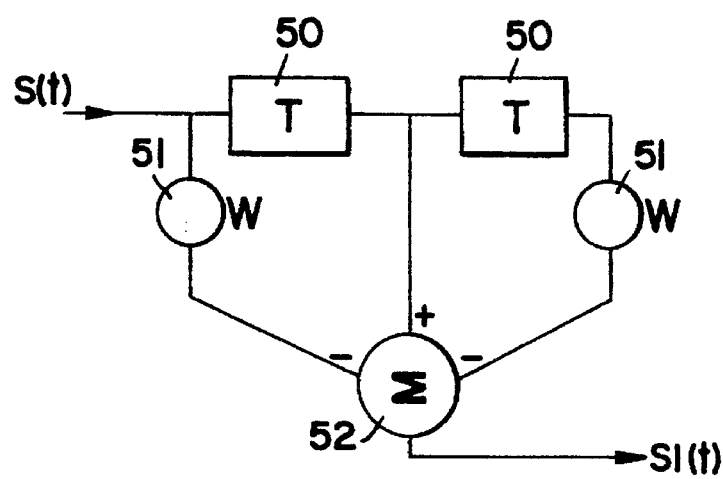
FIG. 2 is a schematic diagram of a three tap filter.

To reduce the ISI, Eq(2A) suggests that one might pass this signal through a transversal filter, F1(s), of the form $1-W\cdot(D+D^{-1})$. This is also known as a three tap filter, which is shown generally in FIG. 2. The purpose of this three tap filter is to force a $W^2$ dependence of the interference terms. Thus, the filtered output becomes:

$$S1(s)=1-W^2(D+D^{-1})^2 \quad (2B)$$

Figure 3:
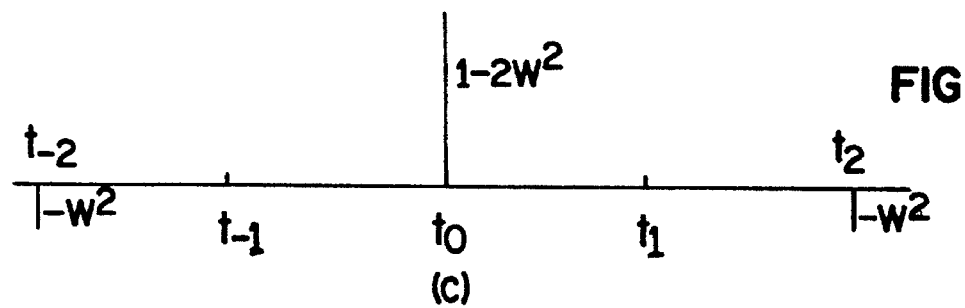
FIG. 3 is a time domain representation of the amplitude values at several sampling points after the original pulse has gone through the three tap filter of FIG. 2.

The sampled results are shown in FIG. 3. It is immediately recognizable that there is a perfect ISI cancellation at the nearest sampling points $t_1$ and $t_{-1}$, while the amplitudes at the second neighbor sampling points are $W^2$ rather than W (W is always less than 1). The contrast between the sample at $t_0$ and $t_1$ is now $1-2\cdot W^2$, compared to $1-W$ without the filter, which is a significant improvement.

Figure 4:
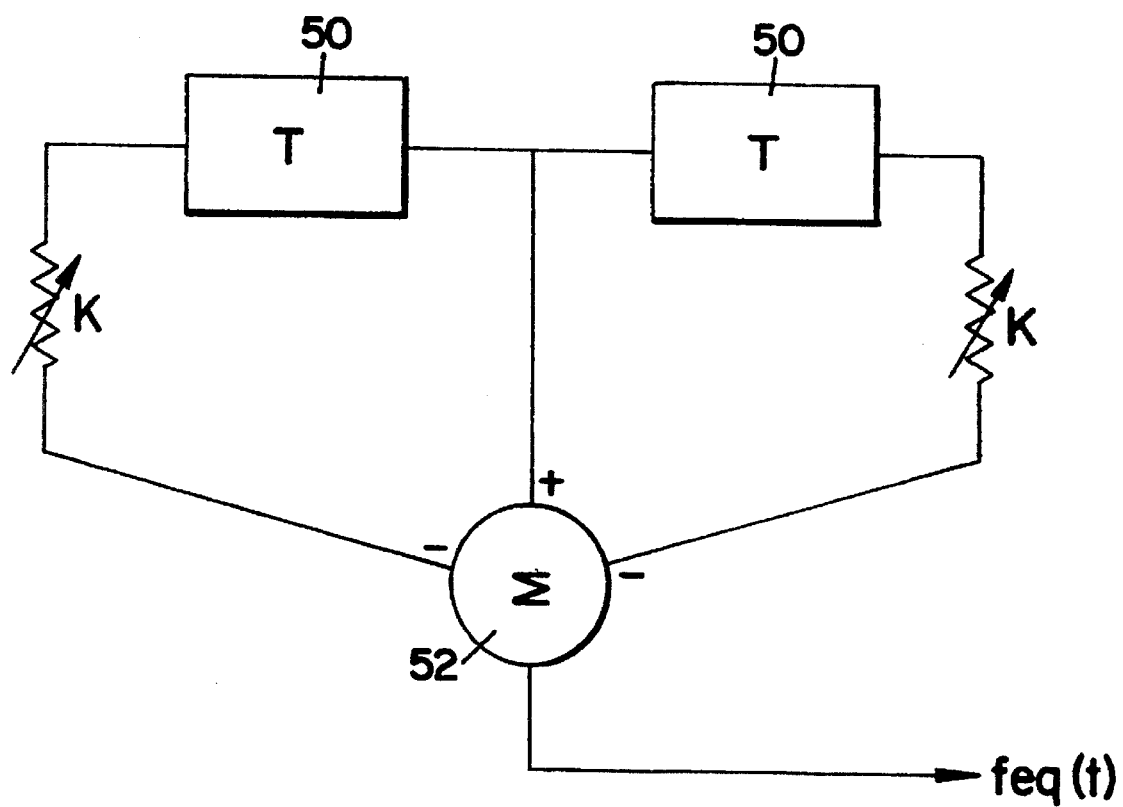
FIG. 4 is a schematic diagram of COSINE filter.

The filter function $1+W(D+D^{-1})$ equals $1+W\cos(\omega T)$ when we replace D by $\exp(-i\omega T)$. Thus, this filter is similar to the well known cosine filter, which is shown in FIG. 4.

For very high density recording (best seen in FIG. 22), the marks on the track could well overlap and W can be significant, as high as 0.3 to 0.4 at the innermost radius. Thus, $W^2$ may be in the range of 0.1 to 0.15. Therefore, a five tap filter, $$F2(s)=1-W\cdot(D+D^{-1})+W^2\cdot(D+D^{-1})^2 \quad (3)$$

provides a signal that is described as $$S2(s)=1+W^3\cdot(D+D^{-2})^3 \quad (4)$$

Figure 5A:
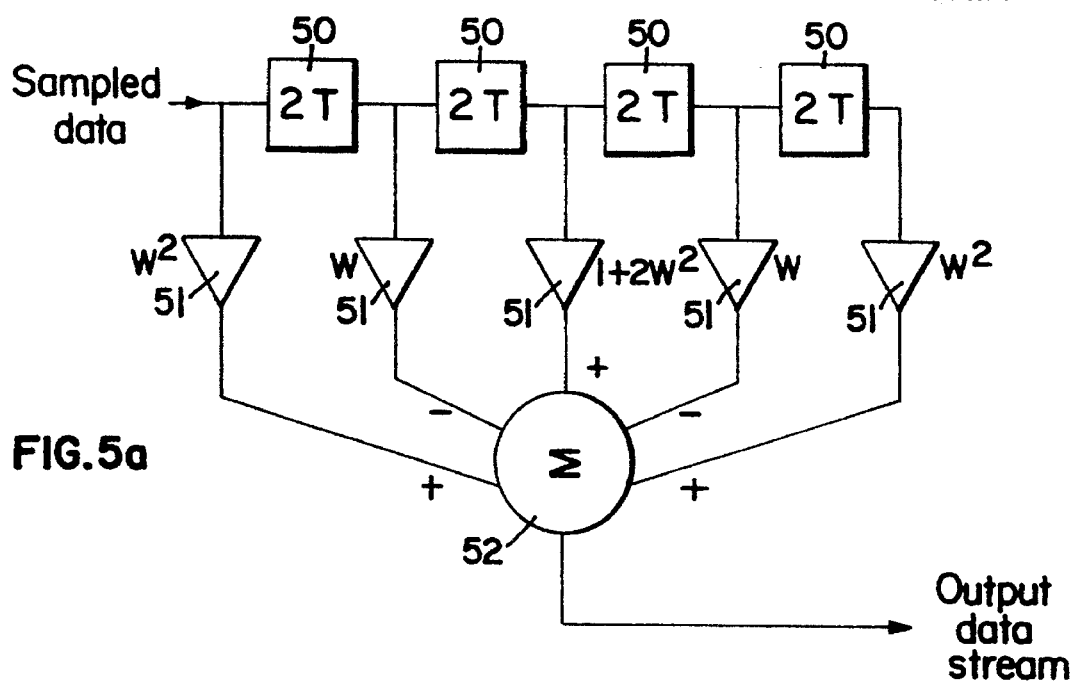
FIG. 5a is a schematic representation of a five tap filter.
Figure 5B:
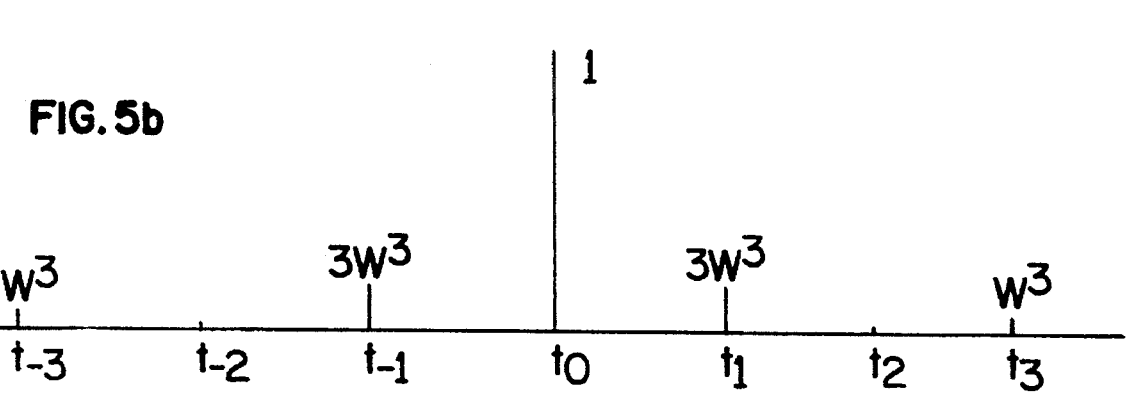
FIG. 5b is a schematic diagram of a readout pulse profile in the frequency domain.

FIG. 5a shows a five tap filter and FIG. 5b shows the amplitudes measured at the various sampling instants. In this case, the amplitude at $t_o$ is 1, while the amplitudes at $t_1$ and $t_{-1}$ are now equal to $3W^3$, thus creating a contrast of $1-3\cdot W^3$ which is better than $1-2\cdot W^2$ created by the three-tap filter. No signal is introduced at $t_2$ and $t_{-2}$ while an amplitude $W^3$ is present at $t_{-3}$ and $t_3$. Therefore, a five-tap filter reduces ISI over and above the improvement achieved by a three-tap filter.

One can then generalize the transfer function for a multiple tap filter and express it as:

$$F^{(n)}(s)=1-W\cdot(D+D^{-1})+W^2\cdot(D+D^{-1})^2-W^3\cdot(D+D^{-1})^3+\ldots +(-1)^n\cdot W^n\cdot(D+D^{-1})-1^n \quad (5)$$

Figure 6:
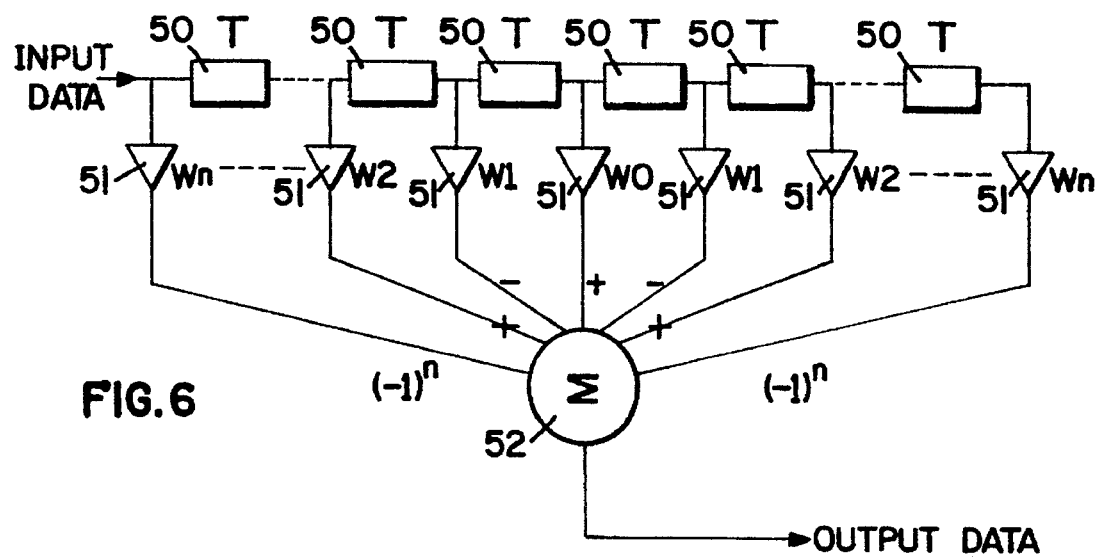
FIG. 6 is a schematic diagram of a transversal filter having (n) taps.

As shown in FIG. 6, one can generically construct this filter. Using this transfer function, a multiple tap transversal filter has a total of 2n+1 tap weights, W0, W1(twice), W2(twice), etc. The tap weights are defined by the following binomial equations.

| | | | |
|---|---|---|---|
| W0 | = | $1+{}_1C^2W^2+{}_2C^4W^4+\ldots+{}_{(n/2)}C^nW^n$ | n even |
| | = | $1+{}_1C^2W^2+{}_2C^4W^4+\ldots+{}_{(n-1)/2}C^{n-1}W^{n-1}$ | n odd |
| -W1 | = | ${}_0C^1W+{}_1C^3W^3+{}_2C^5W^5+\ldots+{}_{(n-2)/2}C^{n-1}W^{n-1}$ | n even |
| | = | ${}_0C^1W+{}_1C^3W^3+{}_2C^5W^5+\ldots+{}_{(n-1)/2}C^nW^n$ | n odd |
| W2 | = | ${}_0C^2W^2+{}_1C^4W^4+{}_2C^6W^6+\ldots+{}_{(n-2)/2}C^{n-1}W^{n-1}$ | n even |
| | = | ${}_0C^2W^2+{}_1C^4W^4+{}_2C^6W^6+\ldots+{}_{(n-1)/2}C^nW^n$ | n odd |
| -W3 | = | ${}_0C^3W^3+{}_1C^5W^5+{}_2C^7W^7+\ldots+{}_{(n-2)/2}C^{n-1}W^{n-1}$ | n even |
| | = | ${}_0C^3W^3+{}_1C^5W^5+{}_2C^7W^7+\ldots+{}_{(n-1)/2}C^nW^n$ | n odd |

$$(-1)^n\cdot Wn=W^n \quad (6)$$

wherein $C^n$ is the binomial coefficient.

It will therefore be apparent to those skilled in the art that the tap coefficients came straight from equation (5) by collecting terms of equal order in D.

It is important to point out that as n becomes large, the function $F^{(n)}(s)$ converges to, $$F^{(n)}(s)_{n\to\infty}=1/(1+W\cdot(D+D^{-1})) \quad (7)$$

Figure 7:
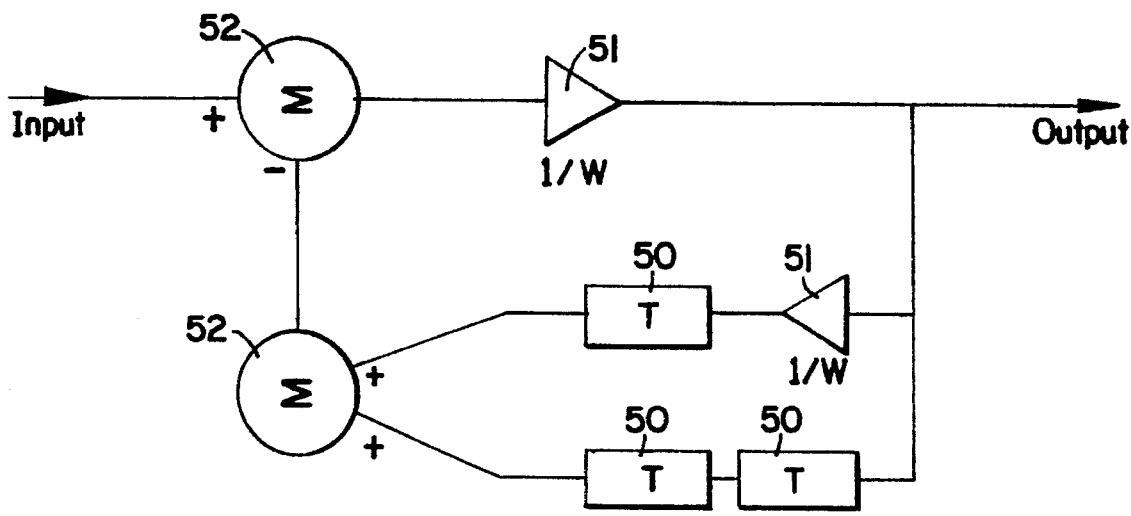
FIG. 7 is a schematic diagram of an IIR filter for total cancellation of ISI.

As those skilled in the art will appreciate from equation 7, as n increases, the generalized filter approaches the inverse of the read response and will cancel out the intersymbol interference completely. In practice a finite number of taps may be used to minimize the ISI. Another aspect of this transfer function is that it is an inverse filter and an alternative embodiment is in the form of an infinite impulse response filter ("IIR"). The generic implementation architecture of an IIR is shown in FIG. 7.

However, a result of the increased number of taps is increased noise amplification. If the input signal is accompanied by a white noise source, then the noise power amplification (GN) due to the filter is given by:

$$GN^{(n)}=T\cdot\int^{1/T}[F^{(n)}(f)]^2df \quad (8)$$

where f is frequency, T is sampling period, and $F^{(n)}(f)$ is derived from equation 5 above and is described as:

$$F^{(n)}(f)=1-2\cdot W\cos(2\pi fT)+4\cdot W^2\cos^2(2\pi fT)+\ldots +(-1)^n\cdot(2)^n\cdot W^n\cos^n(2\pi fT) \quad (9)$$

Figure 8:
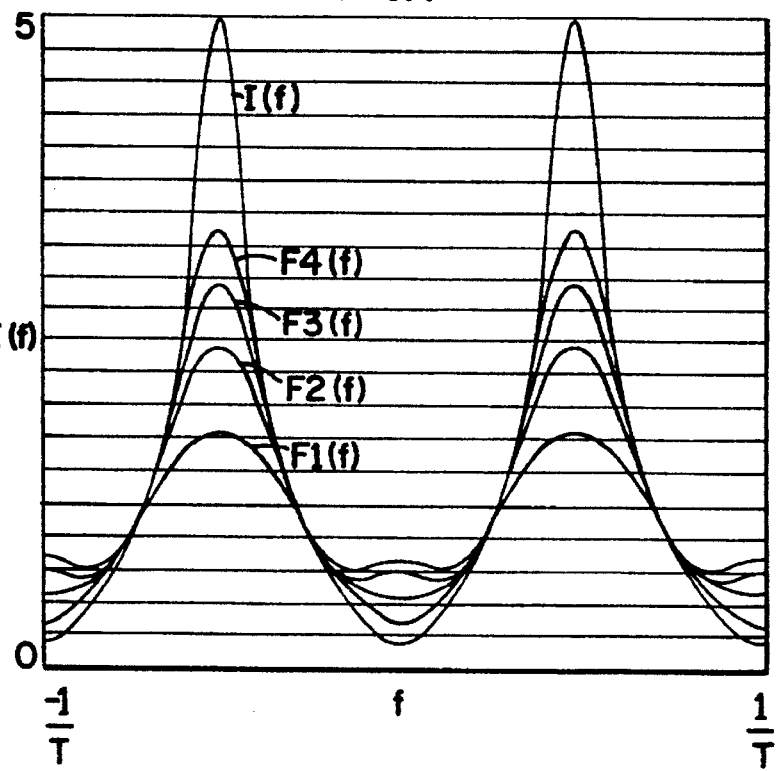
FIG. 8 is a graphical representation of the filter transfer functions for N=1, 2, 3, 4 and infinity.
Figure 9:
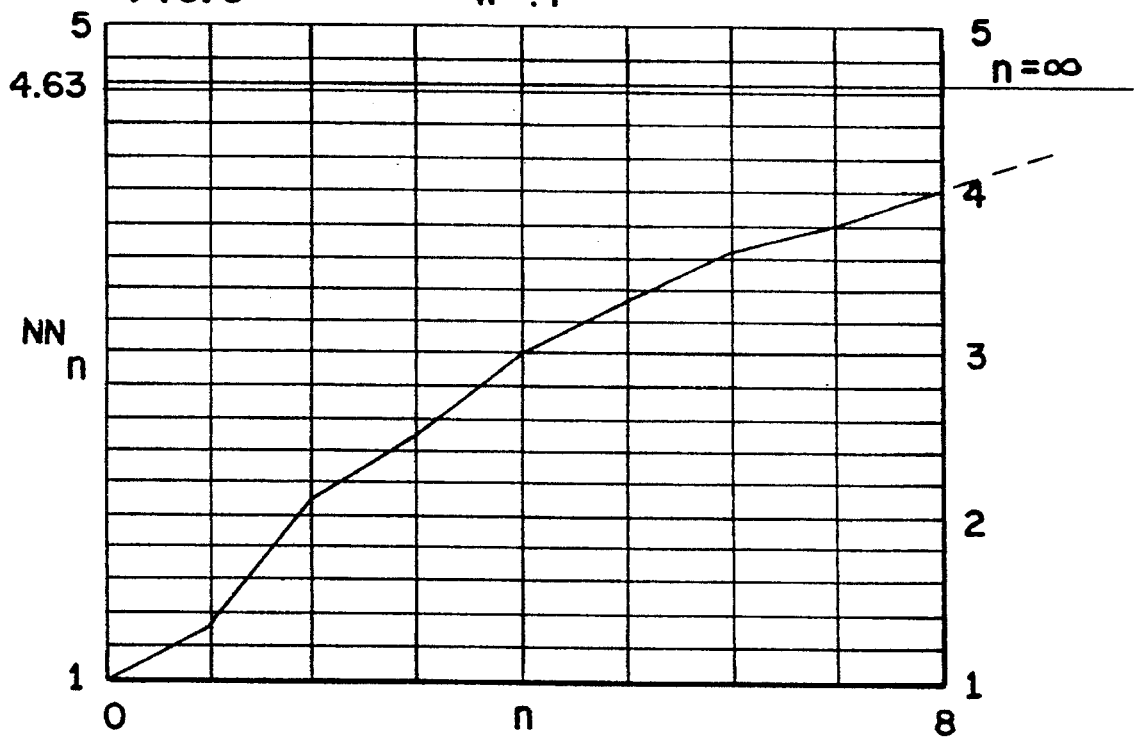
FIG. 9 is a graphical representation of the noise power amplification factors versus a filter order (n) for white noise input.

Several plots of $F^{(n)}(f)$ for n=1, 2, 3, 4 and ∞ are shown in FIG. 8. It may be seen that the noise amplification becomes large as the number of taps increase. Equation 9 can also be used to compute the noise power amplification factors for a white noise input, as illustrated in FIG. 9.

Figure 10:
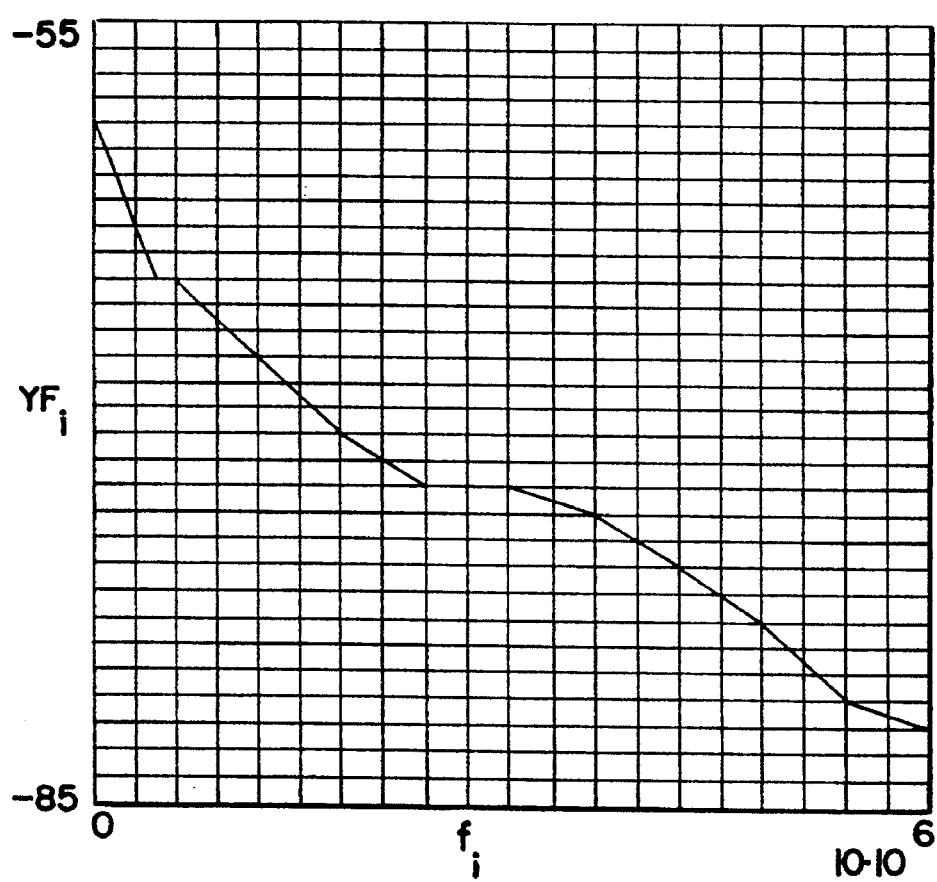
FIG. 10 is a graphical representation of the noise characteristic of an optical recording media (media noise versus frequency)
Figure 11:
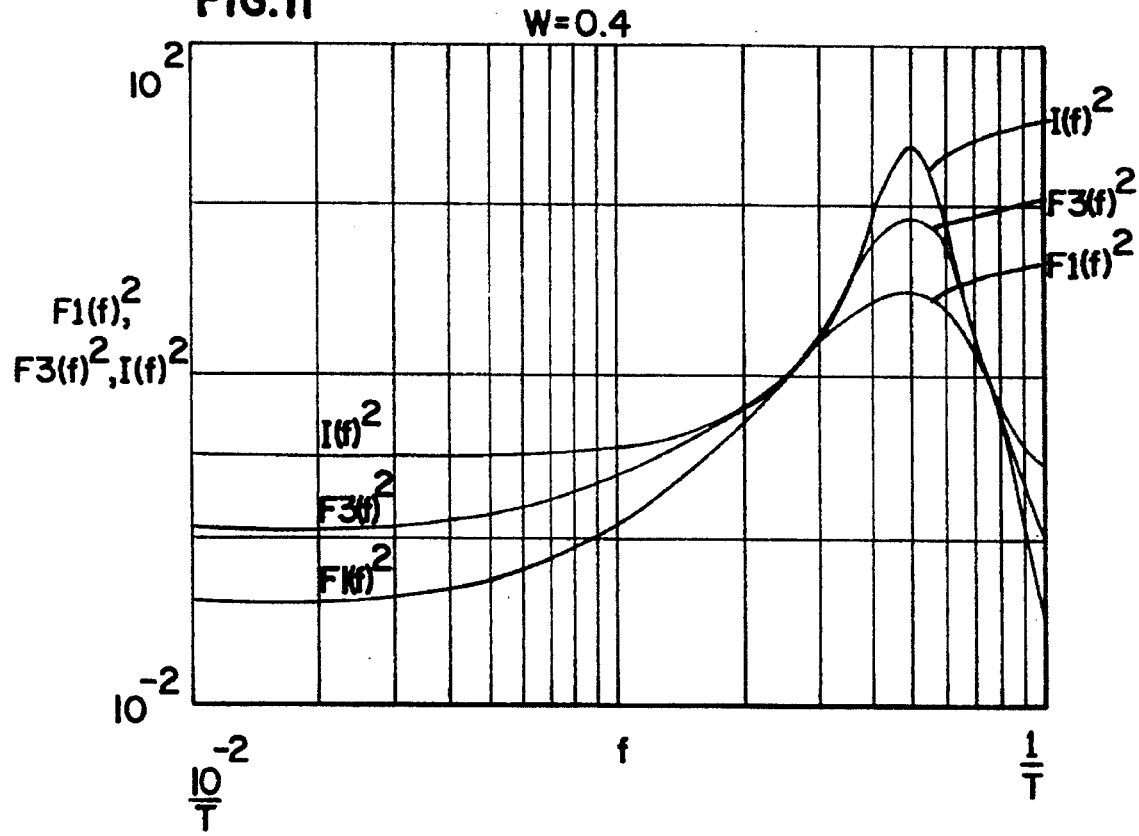
FIG. 11 is a graphical representation of noise amplification as a function of frequency (n being odd)
Figure 12:
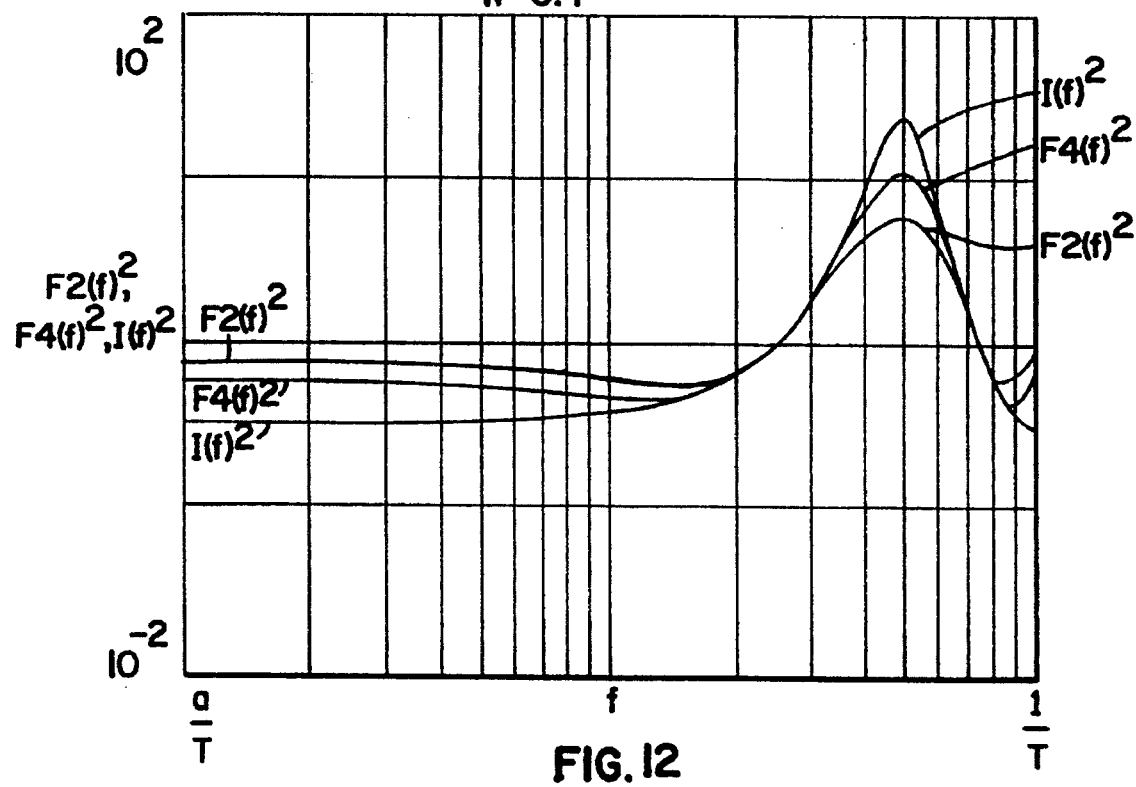
FIG. 12 is a graphical representation of noise amplification as a function of frequency (n being even)

The foregoing suggests that there may exist some optimum n where the ISI is adequately reduced while the noise amplification is not excessive, if the noise in the system is white. However, the noise characteristics of the optical recording media is not white, but rather decreases monotonically from low to high frequencies. This is shown in FIG. 10. Furthermore, the odd order filters (n=1, 3, etc) have better low frequency attenuation characteristics than the even order filters, as demonstrated vividly in FIGS. 11 and 12. Thus, odd order filters are preferred for recording media which exhibit noise characteristics similar to the characteristics illustrated in FIG. 10.

Analytical analysis has shown that for a media with the noise characteristic shown in FIG. 10, the present invention filters with n being odd will attenuate rather than amplify the noise energy. This is due to the highly attenuating characteristics of such filters at low frequencies even though the filter still amplifies the noise energy near half the data sampling frequency, see FIG. 11. Therefore, the net overall result is that noise is attenuated rather than amplified. Almost all known transversal filters amplify the noise energy.

Figure 15:
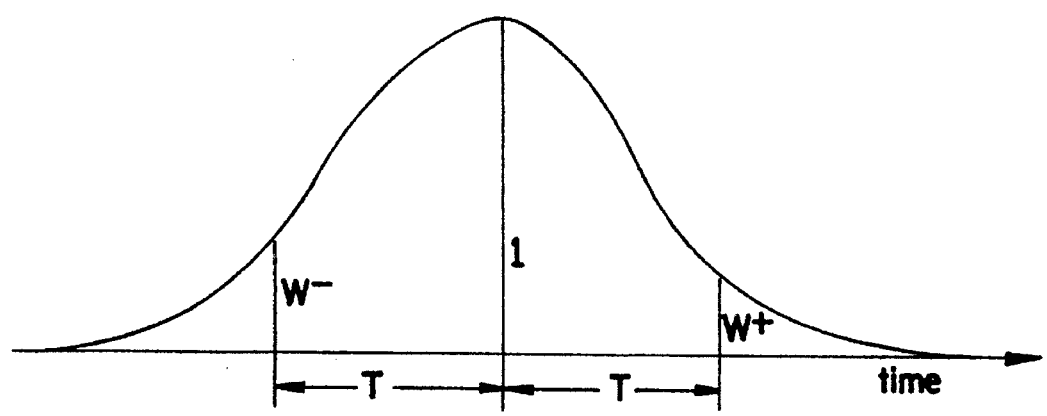
FIG. 15 is a graphical illustration of a readout pulse similar to that depicted in FIG. 1, except that the pulse is asymmetrical.

An alternative embodiment which will next be described provides optimal ISI filtering when the read out pulses are asymmetrical. Referring to FIG. 15, if either the recorded mark, the read beam spot, or both have asymmetry with respect to the radial direction, then the interference weight on the left side of the readout pulse, $W^-$ will be different from that on the right side, $W^+$ (best seen in FIG. 15). In such a case, the transfer function of the generalized filter (and the associated tap weights) is modified as follows:

$$F^{(n)}(s) = 1 - (W^+ \cdot D + W^- \cdot D^{-1}) + \quad (10)$$
$$(W^+ \cdot D + W^- \cdot D^{-1})^2 -$$
$$(W^+ \cdot D + W^- \cdot D^{-1})^3 + \ldots + (-1)^n \cdot$$
$$(W^+ \cdot D + W^- \cdot D^{-1})^n$$

and, $$W0 = 1 + {}_1C^2 W^+ \cdot W^- + {}_2C^4(W^+ \cdot W^-)^2 + \quad n \text{ even}$$
$$\ldots + {}_{(n/2)}C^n(W^+ \cdot W^-)^{n/2}$$
$$= 1 + {}_1C^2 W^+ \cdot W^- + {}_2C^4(W^+ \cdot W^-)^2 + \quad n \text{ odd}$$
$$\ldots + {}_{(n-1)/2}C^{(n-1)}(W^+ \cdot W^-)^{(n-1)/2}$$

$$-W1^+ = {}_0C^1 W^+ + {}_1C^3(W^+ \cdot W^-)W^+ +$$
$$2C^5(W^+ \cdot W^-)W^+ + \ldots +$$
$$(n-2)/2 C^{n-1}(W^+ W^-)^{(n-2)/2} \cdot W^+$$

$$-W1^- = {}_0C^1 W^- + {}_1C^3(W^+ \cdot W^-)W^- + \quad n \text{ even}$$
$$2C^5(W^+ \cdot W^-)W^- + \ldots +$$
$$(n-2)/2 C^{n-1}(W^+ W^-)^{(n-2)/2} \cdot W^-$$

$$-W1^+ = {}_0C^1 W^+ + {}_1C^3(W^+ \cdot W^-)W^+ +$$
$$2C^5(W^+ \cdot W^-)W^+ + \ldots +$$
$$(n-2)/2 C^n(W^+ W^-)^{(n-1)/2} \cdot W^+$$

$$-W1^- = {}_0C^1 W^- + {}_1C^3(W^+ \cdot W^-)W^- + \quad n \text{ odd}$$
$$2C^5(W^+ \cdot W^-)W^- + \ldots +$$
$$(n-2)/2 C^n(W^+ W^-)^{(n-1)/2} \cdot W^-$$

$$W2^+ = {}_0C^2(W^+)^2 + {}_1C^4(W^+ \cdot W^-)(W^+)^2 +$$
$$\ldots + {}_{(n-2)/2}C^n(W^+ W^-)^{(n-2)/2} \cdot (W^+)^2$$

$$W2^- = {}_0C^2(W^-)^2 + {}_1C^4(W^+ \cdot W^-)(W^-)^2 + \quad n \text{ even}$$
$$\ldots + {}_{(n-2)/2}C^n(W^+ W^-)^{(n-2)/2} \cdot (W^-)^2$$

$$W2^+ = {}_0C^2(W^+)^2 + {}_1C^4(W^+ \cdot W^-)(W^+)^2 +$$
$$\ldots + {}_{(n-3)/2}C^{n-1}(W^+ W^-)^{(n-3)/2} \cdot (W^+)^2$$

$$W2^- = {}_0C^2(W^-)^2 + {}_1C^4(W^+ \cdot W^-)(W^-)^2 + \quad n \text{ odd}$$
$$\ldots + {}_{(n-3)/2}C^{n-1}(W^+ W^-)^{(n-3)/2} \cdot (W^-)^2$$

.
.
.

$$(-1)^n \cdot Wn^+ = (W^+)^n$$
$$(-1)^n \cdot Wn^- = (W^-)^n$$

Figure 16:
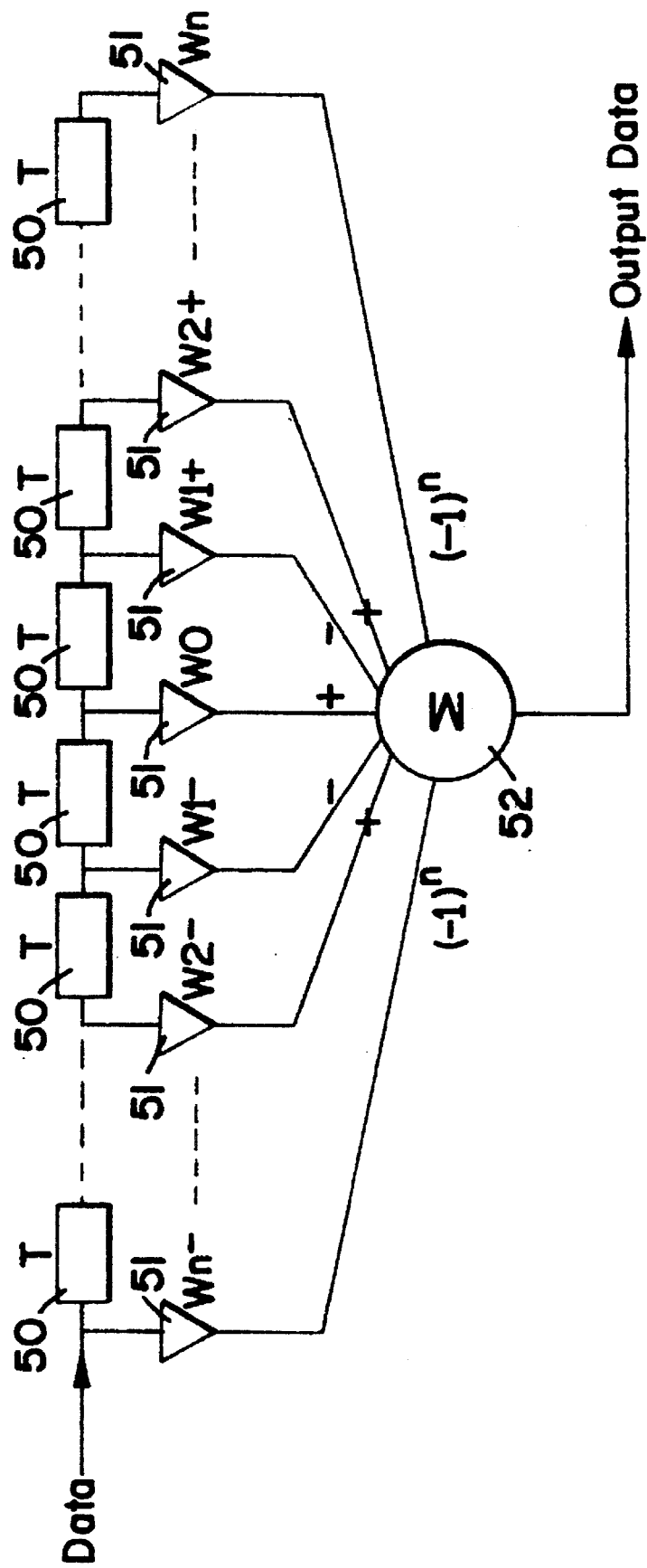
FIG. 16 is a schematic representation of a generalized pulse slimming digital filter having asymmetrical interference weights.

As shown in FIG. 16, the asymmetrical filter has a similar construction to the symmetrical filter.

Figure 17A:
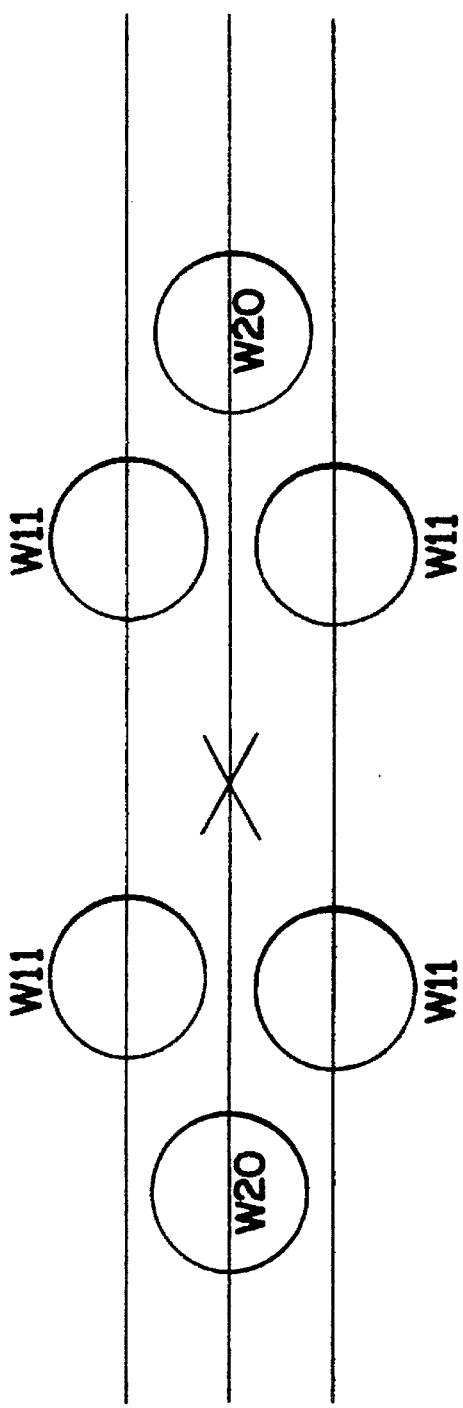
FIGS. 17a and 17b are graphical illustrations of synchronous mark spacing and illustrating even sampling at the mark of interest and odd sampling at one-half bit away from the mark of interest.
Figure 17B:
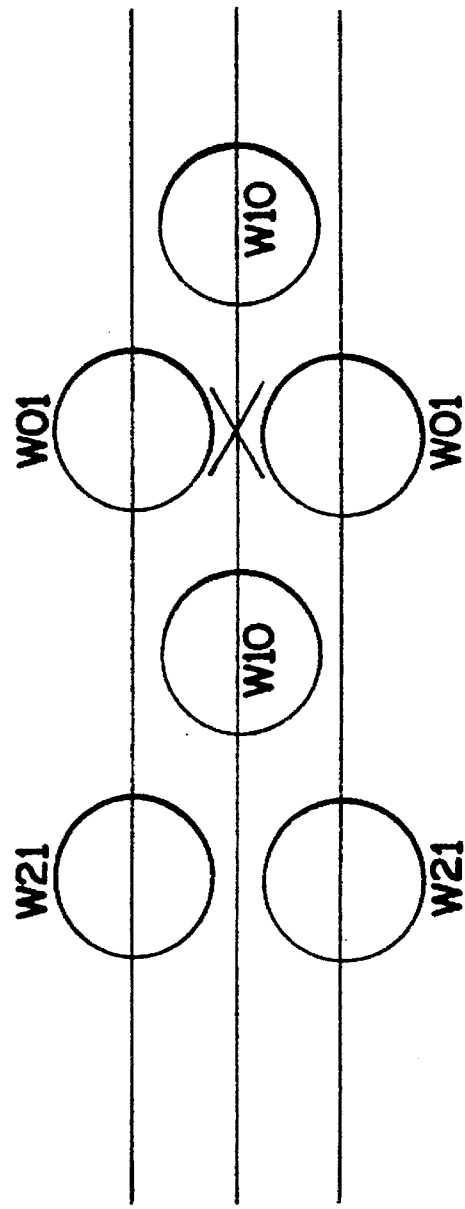

Another alternative embodiment provides filtering for adjacent track interference which will next be described. While the filters described above are primarily concerned with ISI from marks that are on the track of interest, ISI also occurs from marks on adjacent tracks. As shown in FIG. 17, when marks on adjacent tracks are offset by half a mark spacing, there is a unique relationship among the marks neighboring one another wherein:

$$W11 - W10 \cdot W01 = 0 \quad (11)$$

and, $$W11 \cdot W20 - W10 \cdot W21 = 0 \quad (12)$$

W01, W10, W11, W20, and W21 are the amount of interference at the mark of interest, X, from marks A, B, C, D, and E, respectively.

Figure 14:
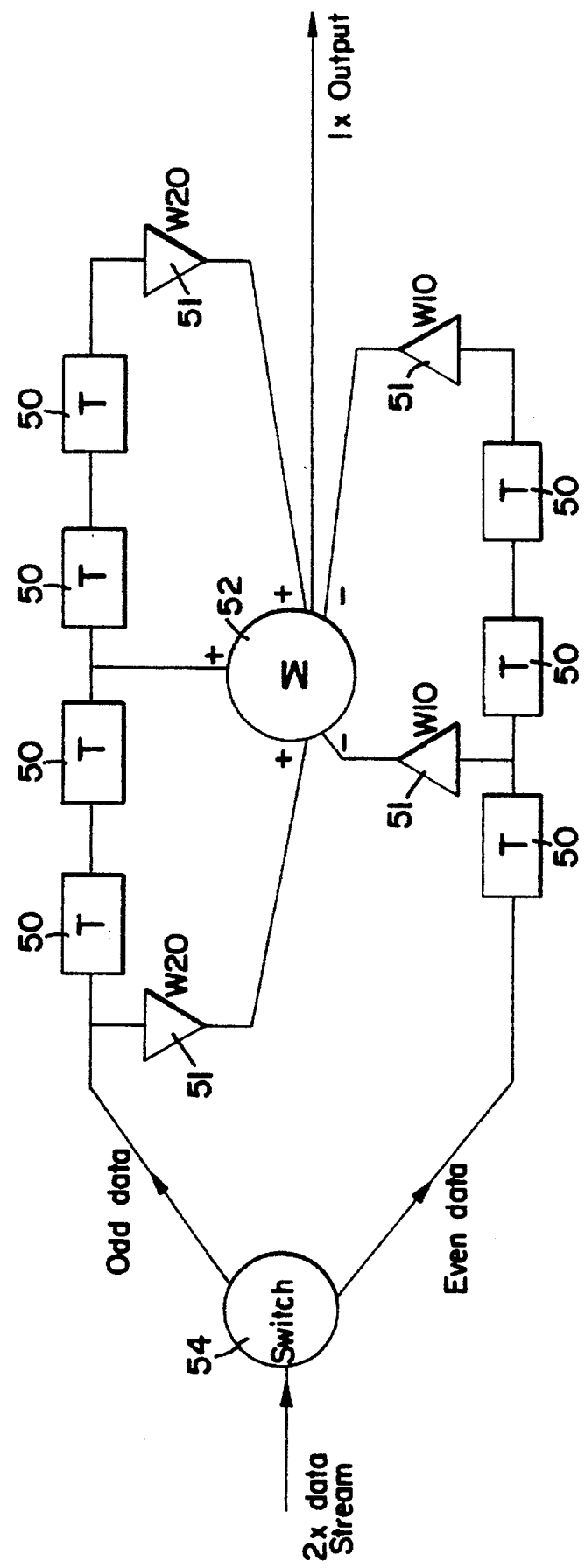
FIG. 14 is a schematic diagram of a coupled filter.

Based on the unique relationship, an equalizer can be constructed by sampling both the even and odd timing positions, where the even positions are the location of the marks of interest. Thus, the sampling frequency is twice that of the data frequency. The equalizer (shown in FIG. 14) is called a coupled filter because adjacent tracks are "coupled together" via the unique relationship that exists among them.

Thus the even samples are sent to a first transversal filter which has a transfer function of $F_A(S) = 1 t W_{20} (D^2 + D^{-2})$. The odd samples are sent to a second transversal filter which has a transfer function of $F_B(S) = W_{10} (D + D^{-1})$. The output of the coupled filter, $S^{eq}(S)$, is described as:

$$S^{eq}(s) = S(s) \cdot \{1 - 2 \cdot W10^2 + 2W20^2 + (2W20 - W10^2)(D^2 + D^{-2}) + W20^2 \cdot (D^4 + D^{-4})\} \quad (13)$$

When the tracks are very close to each other, the algorithm is very effective and a high BER is achieved. However, if the track spacing is relatively large, the coupled filter is not effective.

Figure 20:
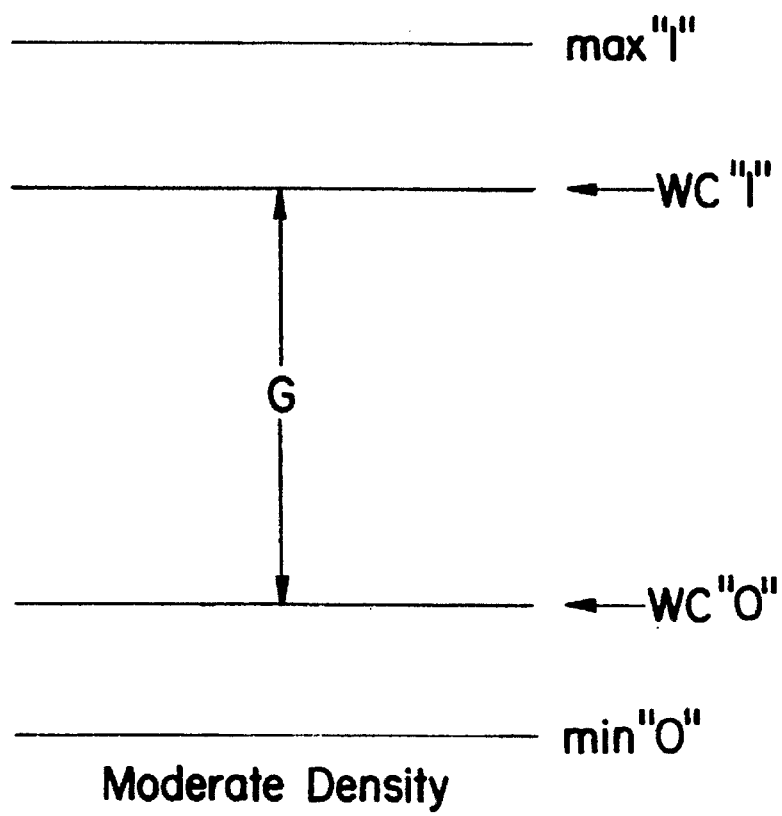
FIG. 20 is a diagrammatic illustration of the band-gap between voltage levels generated by reading marks on a storage media utilizing moderate density.
Figure 21:
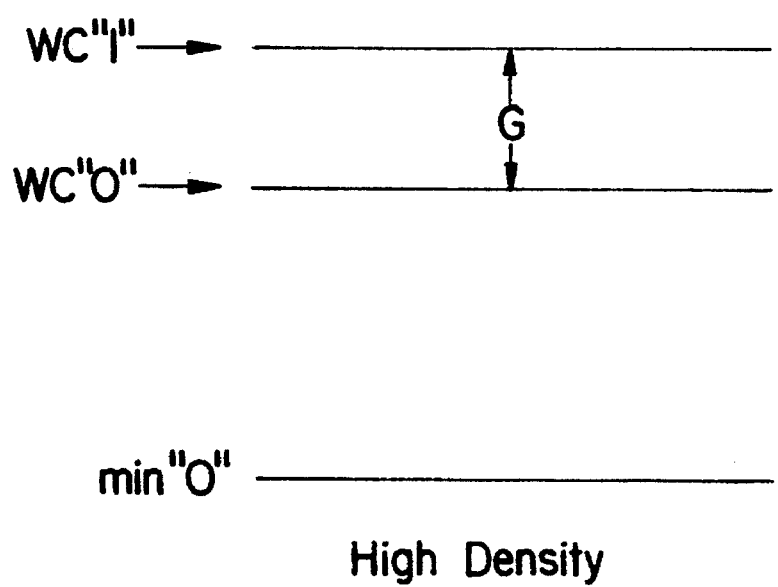
FIG. 21 is a diagrammatic illustration of the band gap of FIG. 20 at high density.

The importance of the foregoing equalization filters can be better appreciated if a bandlevel diagram is examined. At a low recording density (shown in FIG. 18), the levels "1" and "0" are well separated and the "1" band and the "0" band are both narrow (see FIG. 20). Equalization is not required for accurate date reproduction. However, as the density gets higher, the bandgap (G) defined as the difference between the worst-case "1" and the worst-case "0" diminishes and the bands get wider (see FIGS. 19 and 21). At very high recording densities, the marks along the track will overlap (see FIG. 22), and G could well become negative (see FIG. 23). The function of the equalizer is to increase the gap as much as possible and to make accurate level detection possible.

If the marks overlap along the track such equations are no longer accurate, but they still provide a good guide to the relative merits of the equalizers. The closed-form equations are, $$GO = 1 - (2 \cdot W20 + 4 \cdot W11) \quad (14)$$

$$G\_N1 = 1 - 4 \cdot W20^2 - 4 \cdot W11 \quad (15)$$

$$G\_N2 = (1 + 2 \cdot W20 + 4 \cdot W20^2) \cdot (1 - 2 \cdot W20) - 4 \cdot W11 \cdot (1 + 2W20^2) \quad (16)$$

$$G\_N3 = 1 - 16 \cdot W20^4 - 4 \cdot 11 \cdot (1 + 2 \cdot W20^2) \quad (17)$$

GO is the gap without the equalizer, G_N1 is the gap with the three tap filter, etc. W20 and the W11 are the nearest neighbor interference weights along the track and across the track (best seen in FIG. 17).

In addition to widening the bandgap, the read channel signal to noise ratio, SNR, which determines the probability of correct detection for a given equalized bandlevel diagram is also important.

At low recording densities where ISI is absent, it is known that the bit error rate is related to the channel SNR by:

$$BER = 5.1 \cdot (1 - erf(SNR)) \tag{18}$$

Thus, a BER in the range of $10^{-6}$ can be obtained by a channel SNR of 11 dB. However, in the presence of ISI, such SNR is no longer adequate. A new figure of merit, GNR (i.e., band gap divided by the rms noise) determines the BER. It has been determined that the ratio GNR should be about 10 or 20 dB in order to achieve a BER less than 10–6, for the worst-case data pattern. A BER of $10^{-6}$ or less is adequate in optical recording systems due to the use of powerful (EDAC) (error detection and correction) system to detect error caused by media defects.

As noted above, G depends on the interference weights for the different equalizers. However, noise is also amplified by the equalizer(s). If the noise in the read channel is white and assumed to have an RMS amplitude of a, we can show that the noise amplitude after the equalizer is given by:

$$N1 = \sigma \cdot (1 + 2 \cdot W20^2)^{(1/2)} \tag{19}$$

$$N2 = \sigma \cdot (1 + 6 \cdot W20^2 + 6 \cdot W20^4)^{(1/2)} \tag{20}$$

$$N3 = \sigma \cdot (1 + 6 \cdot W20^2 + 18 \cdot W20^4 + 20 \cdot W20^6)(1/2) \tag{21}$$

Figure 13:
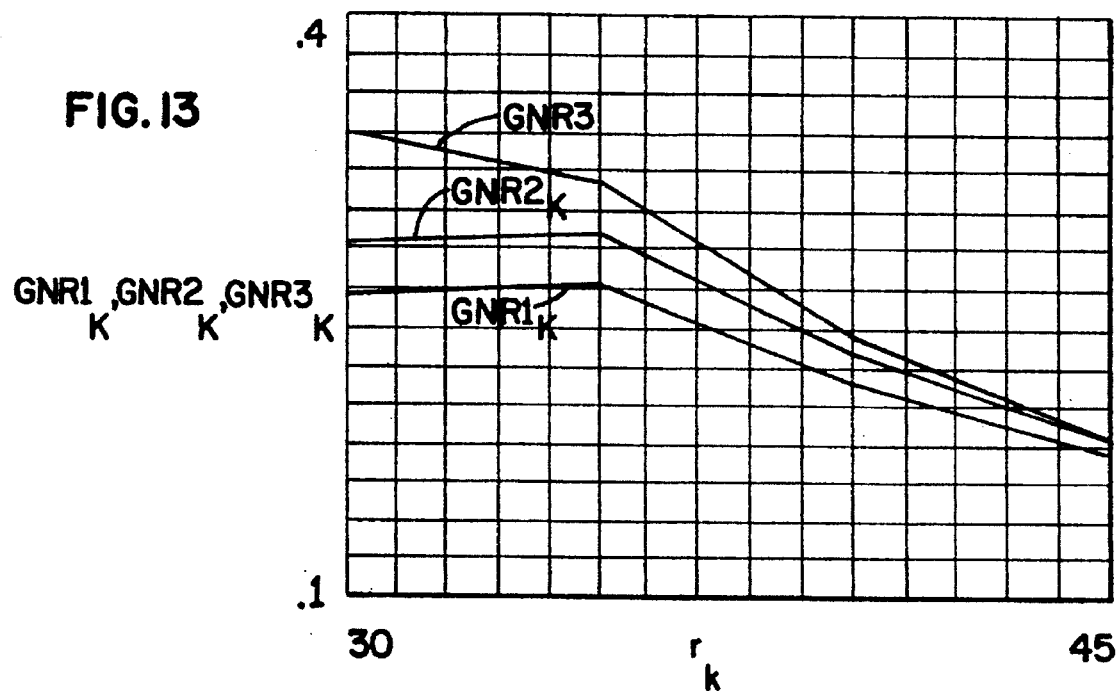
FIG. 13 is a graphical illustration of bandgap/noise as a function of radial position of the mark of interest for several filters.

Combining equations 19 through 21, a GNR for the different equalizers can be found. Since a is common to all the noise terms, it is informative to compare the various equalizers by using the normalized GNR where $\sigma$ is dropped. The results of the three equalizers are shown in FIG. 13. Again the trend of increasing G/N versus order is taken into account.

However, as mentioned earlier, the noise spectra of the optical media is not white, but rather, it contains more energy at lower frequencies and decreases monotonically towards higher frequencies, see FIG. 10. Therefore, the equations (19) through (21) do not really apply to the optical recording media even though the general trend of higher GNR versus order still holds.

If the mark overlap along the track is taken into account, then the interference weights at any given position become pattern dependent and numerical simulation is required to obtain the accurate bandgap and the BER.

In a field operating environment the size and shapes of the marks on the storage media may change. When this occurs, real time adjustment may become necessary in order to maintain an optimal level of filtering ISI. In digital storage devices, the storage media is usually comprised of a header section in which system information is recorded and a section for reading and writing information. This information, in both the data section and the header section, is recorded in the form of individual marks. Real-time adjustment is accomplished by placing one or more isolated marks in the header area, the purpose of which is to acquire the interference ratio W and W11 in real time.

Referring to FIG. 24, this adjustment and calculation is achieved by measuring the magnitude of the readout pulse that occurs when isolated marks are sampled and digitized at $T = T_{-1}$, $T_n$, and $T_{+1}$. This measurement results in amplitudes of $A_{-1}$, $A_n$, and $A_{+1}$ respectively. A divider (best seen in FIG. 24a as block 109) then provides the ratios of $A_{-1}/A_n$ and/or $A_{+1}/A_n$ which provides the value W. Furthermore, the crosstrack interference ratio W11 also needs to be measured in order to determine the threshold value DL. This is accomplished by measuring the pulse generated from isolated marks on the tracks adjacent to the track of interest when a sample is taken at a point where no mark exists on the track of interest. See FIGS. 24a, 24b and 24c. The samples $B_{-1}$ and $B_{+1}$ are acquired at $-T/2$ and/or $T/2$ and the ratio $B_{-1}/A_o$ or $B_{+1}/A_o$ provides the value W11. In practice, the isolated marks for a given track are created at alternate sites in the header area, allowing one to measure W at one site and then W11 at the next site, again illustrated in FIG. 25. These values are then received by the digital signal processor DSP. If the value is outside a certain range, the digital signal processor will recognize that the shape and size of the mark has changed and will recalculate the tap weights and the DL accordingly. The tap weights on the transversal filter and the threshold value DL are then reset. The transversal filter thereby continues to provide the optimal level of filtering intersymbol interference.

Preferred Embodiment

Figure 25:
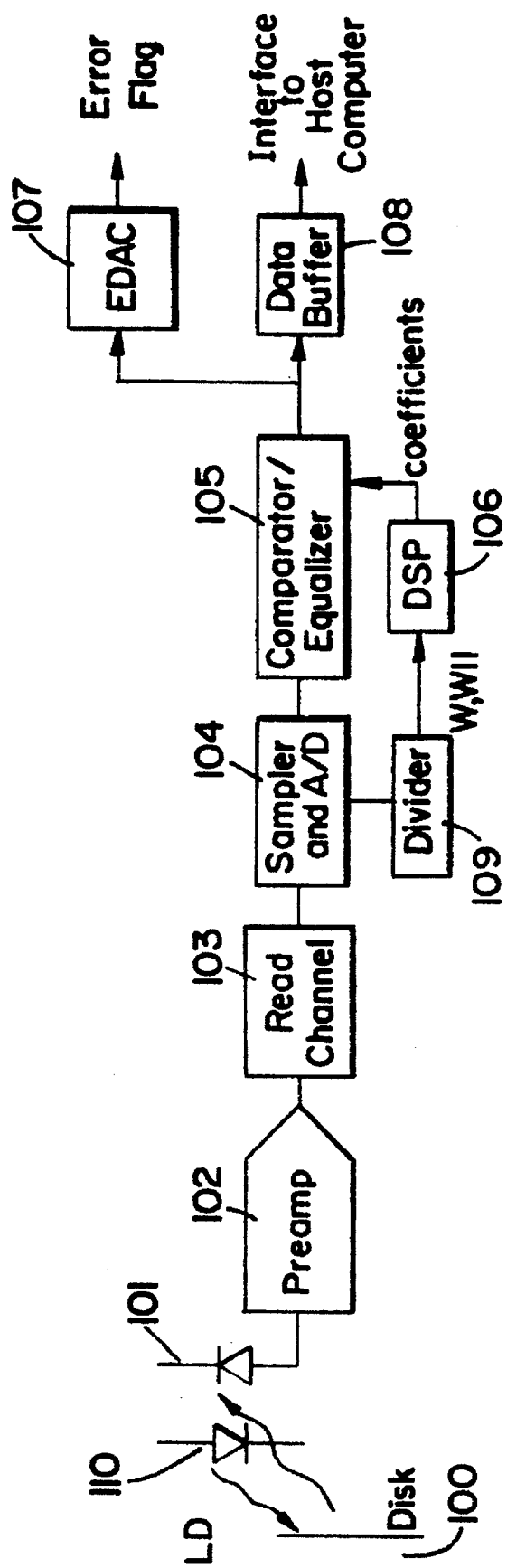
FIG. 25 is a second functional block diagram of the components utilized to implement the present invention.

Referring to FIGS. 24a and 25, there is illustrated a preferred embodiment of a digital equalizer and attendant functional blocks configured in accordance with the principles of the present invention. Those skilled in the art will immediately appreciate the arrangement and operation of the various functional blocks described therein. However, a brief description of the blocks and how the blocks implement the present invention follows.

First, at 100 is illustrated an optical disk on which the marks are located. A laser 100 and an optical pickup 101 operatively interacts with the marks located on disk 100 so as to read the bits of information stored thereon in a known manner. A signal is then created which is transmitted to preamp block 102 to amplify the signal. The amplified signal is transmitted to read channel block 103 which provides amplification and filtering of the optically detected signals from the header and the data area of the disk 100 for use in clock generation and in data detection in the drive.

From the read channel block 103, the signal continues to sampler block 104. Here, amplitude samples of the amplified signals are taken at predetermined discrete intervals according to the predetermined data rate. The sampled information is then digitized by the analog-to-digital convertor (ADC) and transmitted to equalizer block 105. The sampled amplitudes related to the isolated marks are diverted to a divider to generate W and W11 as discussed above, which are then sent to the DSP, 106. As those skilled in the art will recognize, equalizer block 105 is comprised of the transversal filters discussed above. Equalizer block 105 includes signal delays such as shift registers 50; adjustable multiplier devices 51 for implementing predetermined and recalculated tap weights; and summing devices 52 for combining the various multiplied, delayed signals to create a filtered signal. In essence, the equalizer block 105 implements the transversal filters described above using the algorithms and equations described above. An example of a device which performs these functions is manufactured by Harris Corp. under model designation HSP 43891/883.

DSP block 106 utilizes the sampled information from block 104 to measure the gain, determine coefficients (i.e., tap weights) and the threshold level for use in the filter included in equalizer block 105 and to direct the equalizer to implement new coefficients as necessary. An example of a DSP which performs these functions is manufactured by Analog Devices Corporation having model designation ADSP 2105.

Equalized data are then captured by data buffer block 108 sequentially and are buffered until the interface to a host computer, at block 109, reads the data from buffer block 108. Data from equalizer block 105 may also be transmitted to error detection and correction block 107 (EDAC) to determine whether errors have occurred in the reconstruction of the data from disk 100. In the event that an error occurs, an error flag at block 110 is set to signal that re-adjustment of the equalizer parameters is necessary. Those skilled in the art will also recognize that correction routines may also be utilized at block 107.

The above described functional blocks may take on a number of configurations and operational characteristics and are well known in the industry. It is to be understood that even though numerous characteristics and advantages of the present invention have been set forth in the foregoing description, together with details of the structure and function of the invention, the disclosure is illustrative only and changes may be made in detail, especially in matters of the number of delays, multipliers, mark spacing, and track spacing. Also, the present invention may be used with magnetic media, in particular that media which as noise characteristics similar to optical disk media. Further, other modifications and alternations are well within the knowledge of those skilled in the art and are to be included within the broad scope of the appended claims.

What is claimed is:

1. An apparatus for filtering a signal of the type generated by a random access memory head reading a storage media, comprising:

a) a plurality of transmission delay means for delaying the signal for specified periods;

b) a plurality of adjustable multiplier devices having an input and an output, wherein said devices are operatively connected at said input to said delay means in order to multiply the delayed signals by tap weights; and c) summing means, operatively connected to the output of each of said devices, for summing the multiplied, delayed signals from said devices, whereby a filtered signal is created, wherein the transfer function of the apparatus is represented by:

$$F(s) = 1 - W \cdot (D + D^{-1}) + W^2 \cdot (D + D^{-1})^2 + \ldots + (-1)^n \cdot W^n \cdot (D + D^{-1})^n$$

wherein W is a predetermined interference ratio, D is a delay operator equal to $e^{sT}$, s is the LaPlace operator, and wherein said tap weights are determined by collecting terms of the same order D from the transfer function, whereby intersymbol interference in the filtered signal is minimized and any noise which is present with the signal is significantly reduced at low frequencies.

2. The apparatus of claim 1, wherein the number of multiplier devices is 5.

3. The apparatus of claim 1, wherein the number of multiplier devices is 7.

4. The apparatus of claim 1, wherein the media is a disk with information stored in concentric circles each of which has a radius from the center of the disk, and wherein the value of W is predetermined for a given radius, whereby the tap weights are determined for each predetermined value of W.

5. The apparatus of claim 4, wherein the tap weights are determined for a given value of W by a digital signal processor.

6. The apparatus of claim 4, wherein the tap weights are determined for a given value of W by use of a look-up table.

7. The apparatus of claim 4, further comprising means for detecting and correcting data errors in the filtered signal.

8. The apparatus of claim 4, further comprising:

a) means for measuring the pulse profile of an isolated mark on the media, wherein said pulse profile relates to the amplitude of the signal as the isolated mark is read;

b) means for determining W from the measured pulse profile;

c) means for determining new tap weights and a new threshold value according to the determined W; and d) means for setting said multiplier means with the new tap weights.

9. The apparatus of claim 8, wherein the means for determining new tap weights and a new threshold value is comprised of a digital signal processor.

10. The apparatus of claim 8, further comprising comparator means for utilizing a threshold value to determine whether the filtered signal is a binary one or a binary zero, and wherein the threshold value DL can be computed from the value W and W11:

$$DL = (½)(1 - 2W)(1 + 4W^2)(1 + 2W + 4W11)$$

wherein W11 defined as a second interference ratio derived from a second pulse profile from an adjacent radius from the radius where the first pulse profile is located.

11. The apparatus of claim 10, wherein W11 is defined as the ratio of the sampled amplitude on an adjacent radius to the radius where the first pulse profile is located and at a time instant T/2 earlier or T/2 later than the instant when the pulse center occurs to the sample amplitude at the instant when the pulse center occurs and on the radius where the isolated mark is located.

12. The apparatus of claim 1, wherein the signal is an analog signal, and wherein the apparatus is implemented in an analog manner.

13. The apparatus of claim 1, wherein the signal is a sampled digital signal, and wherein the apparatus is implemented in a digital manner.

14. The apparatus of claim 1, wherein the media is an optical disk.

15. The apparatus of claim 1, wherein each multiplier has a tap weight that is adjustable as a function of a readout pulse profile carried by the signal from a substantially isolated mark on the media, wherein the pulse profile relates to the amplitude of the signal as the isolated mark is read.

16. The apparatus of claim 15 further comprising:

(a) means for measuring the readout pulse profile of a substantially isolated mark on the media, wherein the readout pulse profile is carried by the signal;

(b) means for determining new W and W11 according to the measured pulse profiles, wherein W11 is defined as a second interference ratio derived from a second pulse profile from an adjacent radius from the radius where the first pulse profile is located;

c) means for determining the new tap weights and a new threshold value, wherein threshold value is utilized to determine whether the filtered signal is a binary one or a binary zero; and d) means for setting new tap weights in said multiplier devices.

17. The apparatus of claim 16, further comprising: comparator means for utilizing the threshold value, wherein the threshold value DL can be computed from the value W and W11:

$$DL=(\tfrac{1}{2})\,(1-2W)\,(1+4W^2)\,(1+2W+4W11).$$

18. The apparatus of claim 17, wherein W11 is defined as the ratio of the sampled amplitude on an adjacent radius to the radius where the first pulse profile is located and at a time instant T/2 earlier or T/2 later than the instant when the pulse center occurs to the sample amplitude at the instant when the pulse center occurs and on the radius where the isolated mark is located.

19. The apparatus of claim 18, wherein the means for determining new tap weights is comprised of a digital signal processor.

20. A method for filtering a signal comprising the steps of:
   a) receiving a generated signal;
   b) filtering the generated signal through a filter including adjustable multiplier device means for multiplying the generated signal by tap weights, wherein the filter has the following transfer function F(s):

$$F(s)=1-W.(D+D^{-1})+W^2.(D+D^{-1})^2+\ldots+(-1)^n.W^n.(D+D^{-1})^n$$

wherein W is a predetermined interference ratio, D is a delay operator equal to $e^{sT}$, s is the LaPlace operator, and wherein said tap weights are determined by collecting terms of the same order D from the transfer function, whereby intersymbol interference in the filtered signal is minimized and any noise which is present with the signal is significantly reduced at low frequencies.

21. The method of claim 20, wherein the generated signal is generated by a random access memory head reading data from an optical disk of the type wherein data is stored on marks in the optical disk media and the marks are arranged in concentric tracks of differing radius from the center of the optical disk, comprising the further steps of:
   a) determining W for each track prior to reading the track;
   b) calculating for new W the corresponding tap weights; and
   c) fixing each multiplier device means to the calculated tap weight.

22. The method of claim 21 further comprising the step of: measuring a pulse profile generated by a substantially isolated mark on a track, wherein the pulse profile relates to the amplitude of the signal as the isolated mark is read, and wherein W equals the ratio of the sampled amplitude at a time instant T earlier or T later than the instant when the mark center occurs divided by the sample amplitude when the mark center occurs.

23. The method of claim 22 further comprising the step of detecting a data error and recalculating W.

24. An apparatus for filtering a signal, of the type generated by a random access memory head reading a storage media and the signal is an asymmetrical pulse, the apparatus comprising:
   a) a plurality of transmission delay means for delaying the signal for specified periods;
   b) a plurality of adjustable multiplier devices having an input and an output, wherein said devices are operatively connected at said input to said delay means in order to multiply the delayed signals by tap weights; and
   c) summing means, operatively connected to the output of each of said devices, for summing the multiplied, delayed signals from said devices, whereby a filtered signal is created,
   wherein the transfer function of the apparatus is represented by:

$$F(s)=1-(W^+.D+W^-.D^{-1})+(W^+.D+W^-.D^{-1})^2+\ldots+(-1)^n.(W^+.D+W^-.D^{-1})^n$$

wherein $W^+$ and $W^-$ are predetermined interference ratios, D is a delay operator equal to $e^{sT}$, s is the LaPlace operator, and wherein said tap weights are determined by collecting terms of the same order D from the transfer function, whereby intersymbol interference in the filtered signal is minimized and any noise which is present with the signal is significantly reduced at low frequencies.

25. The apparatus of claim 24, wherein the number of multiplier devices is 5.

26. The apparatus of claim 24, wherein the number of multiplier devices is 7.

27. The apparatus of claim 24, further comprising:
   a) means for measuring the pulse profile of an isolated mark on the media, wherein said pulse profile relates to the amplitude of the signal as the isolated mark is read;
   b) means for determining W from the measured pulse profile;
   c) means for determining new tap weights and a new threshold value according to the determined W; and
   d) means for setting said multiplier means with the new tap weights.

28. The apparatus of claim 27, wherein the means for determining new tap weights and a new threshold value is comprised of a digital signal processor.

29. A method for filtering an asymmetrical signal comprising the steps of:
   a) receiving a generated signal;
   b) filtering the generated signal through a filter including adjustable multiplier device means for multiplying the generated signal by tap weights, wherein the filter has the following transfer function F(s):

$$F(s)=1-(W^+.D+W^-.D^{-1})+(W^+.D+W^-.D^{-1})^2+\ldots+(-1)^n.(W^+.D+W^-.D^{-1})^n$$

wherein $W^+$ and $W^-$ are predetermined crosstalk interference ratios, D is a delay operator equal to $e^{sT}$, s is the LaPlace operator, and wherein said tap weights are determined by collecting terms of the same order D from the transfer function, whereby intersymbol interference in the filtered signal is minimized and any noise which is present with the signal is significantly reduced at low frequencies.

30. An apparatus for filtering a signal from marks on both the same track and an adjacent track of an optical disk, the apparatus comprising:
   (a) means for sampling the signal at odd and even sampling intervals to generate information signals respectively sampled at the even and odd intervals;
   (b) a first means for filtering the information signal sampled at the even intervals;
   (c) a second means for filtering the information signal sampled at the odd intervals; and
   (d) means for adding the information signal filtered by the first filtering means to the information signal filtered by the second means for creating a filtered signal with decreased intersymbol interference.

31. The apparatus of claim 30 wherein:
(a) the first means for filtering is a transversal filter that has a plurality of taps and is defined by a transfer function, $F(s)=1+W_{20}(D^2+D^{-2})$; and
(b) the second means for filtering is a transversal filter that has a plurality of taps and is defined by a transfer function, $F(s)=1+W_{10}(D+D^{-1})$ wherein D is a delay operator equal to $e^{st}$, s is the LaPlace operator, $W_{10}$ is an interference ratio of the sample amplitude taken at the nearest odd point of sampling to the sample amplitude at the mark center and $W_{20}$ is an interference ratio of the sample amplitude taken at the even points of sampling.

32. The apparatus of claim 31, wherein each tap has a tap weight that is determined and fixed before the transversal filter receives the signal.

33. The apparatus of claim 31, wherein each tap has a tap weight that is adjustable according to a readout pulse profile of one or more marks on the optical disk, wherein the pulse profile relates to the amplitude of the signal as the isolated mark is read.

34. A method for filtering a signal in order to minimize intersymbol interference, the method comprising the steps of:
(a) sampling the signal at odd and even sampling intervals to generate information signals respectively sampled at the odd and even intervals;
(b) filtering the information signal sampled at the even intervals through a first filter;
(c) filtering the information signal sampled at the odd intervals through a second filter; and
(d) adding the signal that is filtered through the first filter to the signal that is filtered through the second filter.

35. The method of claim 34 wherein:
(a) the first filter is a transversal filter that has a plurality of taps and is defined by a transfer function, $F(s)=1+W_{20}(D^2+D^{-2})$; and
(b) the second filter is a transversal filter that has a plurality of taps and is defined by a transfer function, $F(s)=1+W_{10}(D+D^{-1})$ wherein D is a delay operator equal to $e^{st}$, s is the LaPlace operator, $W_{10}$ is an interference ratio of the sample amplitude taken at the nearest odd point of sampling to the sample amplitude at the mark center and $W_{20}$ is an interference ratio of the sample amplitude taken at the even points of sampling.

36. An apparatus for retrieving information from an optical information storage medium wherein a retrieved signal includes intersymbol interference, the apparatus comprising:
(a) an optical storage medium having a plurality of tracks and at least one isolated mark for each track;
(b) means for retrieving information from the storage medium wherein the information is in the form of a signal;
(c) means for measuring a readout pulse profile of the isolated marks in order to determine an interference ratio and threshold value, wherein the pulse profile relates to the amplitude of the signal as the, isolated mark is read; and
(d) means for filtering the retrieved signal in accordance with values determined by the interference ratio and threshold value, whereby the amount of intersymbol interference is reduced.

37. The apparatus of claim 36, wherein the storage medium further includes a plurality of marks aligned along at least one track.

38. The apparatus of claim 37, wherein the storage medium is a disk having a hub, and wherein the tracks are comprised of concentric circles formed around the hub of the disk.

39. The apparatus of claim 37, wherein the storage medium contains at least one specific prerecorded mark placed on at least one track wherein the specific prerecorded marks are used to measure the amount of intersymbol interference.

40. The apparatus of claim 39, wherein the prerecorded marks are positioned so that they will not receive intersymbol interference from other marks.

41. The apparatus of claim 40, wherein the specific prerecorded marks are organized into a first portion for storing data and a second portion for storing system information.

42. The apparatus of claim 41, wherein the specific prerecorded marks are contained in the second portion for storing system information.

* * * * *